(12) United States Patent  (10) Patent No.: US 7,394,677 B2
Murakami et al.  (45) Date of Patent: Jul. 1, 2008

(54) FERROELECTRIC RANDOM ACCESS MEMORY DEVICE, DISPLAY DRIVE IC AND ELECTRONIC EQUIPMENT

(75) Inventors: Yasuhiko Murakami, Suwa (JP); Yasunori Koide, Matsumoto (JP)

(73) Assignee: Seiko Epson Corporation (JP)

( * ) Notice: Subject to any disclaimer, the term of this patent is extended or adjusted under 35 U.S.C. 154(b) by 78 days.

(21) Appl. No.: 11/455,295

(22) Filed: Jun. 16, 2006

(65) Prior Publication Data
US 2007/0008767 A1  Jan. 11, 2007

(30) Foreign Application Priority Data
Jul. 7, 2005  (JP) .............................. 2005-199437
Feb. 22, 2006 (JP) .............................. 2006-045567

(51) Int. Cl.
*G11C 11/22* (2006.01)
(52) U.S. Cl. ........................................ 365/145; 365/149
(58) Field of Classification Search ................. 365/145, 365/149, 63, 51
See application file for complete search history.

(56) References Cited
U.S. PATENT DOCUMENTS
6,151,244 A * 11/2000 Fujino et al. ................. 365/149
6,784,468 B2   8/2004 Honda
6,816,410 B2 * 11/2004 Kleveland et al. ......... 365/185.03
6,882,556 B2   4/2005 Fuhrmann et al.

FOREIGN PATENT DOCUMENTS
JP  2002-170935   6/2002
JP  2003-197869   7/2003
KR  10-2004-0012545  2/2004

* cited by examiner

*Primary Examiner*—Vu A Le
(74) *Attorney, Agent, or Firm*—Harness, Dickey & Pierce, P.L.C.

(57) ABSTRACT

A ferroelectric memory device being short in the bit line direction. The ferroelectric memory device is structured including a first word line extending in the first direction; a plurality of element regions arrayed in the first direction on both sides of the first word line; a plurality of ferroelectric capacitors connected to the respective element regions and driven by the first word line. Each of the element regions preferably has a stair-like shape when seen in a plane view and the first word line is preferably arranged bent between the element regions.

18 Claims, 20 Drawing Sheets

FERROELECTRIC RANDOM ACCESS MEMORY DEVICE, DISPLAY DRIVE IC AND ELECTRONIC EQUIPMENT

CROSS-REFERENCES TO RELATED APPLICATIONS

The entire disclosure of Japanese Patent Application No. 2005-199437, filed on Jul. 7, 2005, and Japanese Patent Application No. 2006-045567, filed Feb. 22, 2006, are expressly incorporated herein by reference.

BACKGROUND

1. Technical Field

The present invention relates to a ferroelectric random access memory device, display drive IC, and electronic equipment.

2. Related Art

Ferroelectric Random Access Memory (FeRAM) devices are used for storing information using the hysteresis that can be seen between the polarization and electric field of ferroelectric materials, and have been a focus of attention from the viewpoints of speed, lower power consumption and non-volatility.

For these FeRAM devices, just as other memory devices, the high-level integration or miniaturization of memory cells has been a longstanding problem.

For example, Japanese Patent Laid-Open Publication No. 2002-170935 describes a FeRAM where active regions to be connected to a predetermined bit line are arranged in a line along the bit line; and discloses a technique for reducing the area of a FeRAM cell by devising the shape and arrangement of plate lines, word lines and active regions.

However, with conventional FeRAM structures, the length of the bit line (direction) is long and there is a problem in that the size of the FeRAM is large.

Meanwhile, FeRAMs have been used in various electronic equipment because of their speed, low power consumption and non-volatility. For example, with a display drive IC in a display device, because of the connection to the display, the wiring spacing is sometimes set larger than the ordinary design rule (for example, the smallest wiring spacing).

Accordingly, in addition to pursuing high-level integration or miniaturization of a FeRAM device, it is also necessary to achieve high-level integration of memory cells while maintaining allowed wiring spacing.

SUMMARY

An advantage of some aspects of the invention is that a FeRAM device, display drive IC and the like that can solve the foregoing problems can be provided.

In other words, the invention aims to realize high-level integration or miniaturization of a FeRAM device. Particularly, it aims to provide a FeRAM device achieving high integration in the direction the bit line extends. The invention also aims to achieve high-level integration or miniaturization (optimization of layout) of a FeRAM device used in a display drive integrated circuit (IC). In Particular, it aims to improve the integration in the direction the bit line extends in the FeRAM device used in the display drive IC.

The foregoing goals are achieved by combining the characteristics described in the scope of the claims in this application.

(1) In order to achieve the above goals, according to a first embodiment of the invention, a ferroelectric memory device has: a first word line extending in a first direction; a plurality of element regions arrayed in the first direction on both sides of the first word line; and a plurality of first ferroelectric capacitors each connected to the element regions and driven by the first word line.

According to the first embodiment of the invention, because each word line drives the first ferroelectric capacitors connected to the element regions arrayed on both sides of the word line, it is possible to provide a ferroelectric memory device having a short length in the second direction perpendicular to the first direction. Particularly, according to the foregoing embodiment of the invention, the length of the ferroelectric memory device in the second direction is shorter than that of a ferroelectric memory device where a plurality of element regions are arrayed on both sides of each bit line.

(2) Each of the first ferroelectric capacitors is of a shape with its length in the first direction being longer than its length in the second direction perpendicular to the first direction.

According to the foregoing embodiment of the invention, because the first ferroelectric capacitor is of a shape with its width in the first direction being wider than its width in the second direction—perpendicular to the first direction, the quantity of electric charge that can be accumulated in the ferroelectric capacitors increases, thereby increasing the writing and reading margins. Also, writing and reading features are improved.

(3) It is preferable that the ferroelectric memory device further includes: a plurality of first word lines; a plurality of second word lines extending in the first direction so that the first word lines and the second word lines are arranged alternately; and a plurality of second ferroelectric capacitors each connected to the element regions and driven by the second word lines. The element regions are preferably arrayed between the respective first word lines and second word lines; and each of the second ferroelectric capacitors is preferably of a shape with its width in the first direction being wider than its width in a second direction perpendicular to the first direction.

According to the foregoing embodiment of the invention, at least two ferroelectric capacitors are connected to each predetermined element region and the word lines driving the respective ferroelectric capacitors are located on both sides of each predetermined element region, so it is possible to provide a ferroelectric memory device achieving high-level integrity and having a short length in the second direction. Also, because each second ferroelectric capacitor is of a pattern with its length in the first direction being longer than the length in the second direction—perpendicular to the first direction, the quantity of electric charge that can be accumulated in the ferroelectric capacitors increases, thereby increasing the writing and reading margins. Also, writing and reading features are improved.

(4) In the foregoing ferroelectric memory device, it is preferable that each element region has one end the first ferroelectric capacitor is connected to and another end the second ferroelectric capacitor is connected to, in the first direction. Also, it is preferable that the element regions are arranged on both sides of each first line and each second word line alternately in a zigzag format in the first direction.

According to the foregoing embodiment of the invention, because the element regions are each arranged between the respective first and second word lines in a zigzag formant in the first direction, the spacing in the second direction between the element regions is short, thereby enabling the provision of a ferroelectric memory device having a short length in the second direction.

(5) In the foregoing ferroelectric memory device, it is preferable that each element region has a stair-like shape when seen in a plane view; for each element region, the widths at both ends is narrower than the width at the middle part; and the first word lines and second word lines extend in the first direction while bending between the adjacent element regions.

According to the foregoing embodiment of the invention, because the spacing in the second direction between the element regions is short, it is possible to provide a ferroelectric memory device having a short length in the second direction.

(6) Regarding the foregoing ferroelectric memory device, it is preferable that, in each of the element regions arranged on one side of each first word line, its ends are misaligned in the different directions as seen from the second direction perpendicular to the first direction; and, in each of the element regions arranged on the other side of each first word line, both ends are misaligned in the opposite directions as seen from the first direction.

According to this embodiment of the invention, each element region has an enough width although the spacing in the second direction between the element regions is short. Accordingly, the transistors formed in the element regions can achieve enough drive performance. Consequently, sufficient speed in accessing the ferroelectric capacitors can be ensured.

(7) In the foregoing ferroelectric memory device, it is preferable that the first word lines and second word lines bend in accordance with the arrangement and shapes of the adjacent element regions.

According to the foregoing embodiment of the invention, because the respective word lines are bent, the spacing in the second direction between the element regions is short, thereby enabling the provision of a ferroelectric memory device having a short length in the second direction.

(8) In the foregoing ferroelectric memory device, it is preferable that each of the first word lines and second word lines includes: a main line extending in the first direction; and a plurality of branch lines branched from the main line and extending over the element regions adjacent to the main line. Also, it is that the first word line bends also in accordance with the arrangement of the branch lines of the second word line; and the second word line bends also in accordance with the arrangement of the branch lines of the first word line.

According to the foregoing embodiment of the invention, the spacing in the second direction between the element regions is short, thereby enabling the provision of a ferroelectric memory device having a short length in the second direction.

(9) It is also preferable that the ferroelectric memory device further include a plurality of plate lines connected to a plurality of first ferroelectric capacitors and a plurality of second ferroelectric capacitors.

According to the foregoing embodiment of the invention, the first and second ferroelectric capacitors connected to the respective plate lines are driven by different word lines, therefore, it is possible to provide a ferroelectric memory device having a short length in the second direction and able to access predetermined ferroelectric capacitors.

(10) In the foregoing ferroelectric memory device, it is preferable that the element regions are arranged on both sides of each first word line and second word line in the first direction; and the first ferroelectric capacitor connected to a predetermined element region is connected to the same plate line as the second ferroelectric capacitor connected to another element region adjacent to the predetermined element region with the second word line sandwiched therebetween.

According to the foregoing embodiment of the invention, in the structure where the first and second ferroelectric capacitors connected to the plate lines are driven by different word lines, the respective plate lines can be arranged substantially straight, thereby enabling the reduction of the loads on the plate lines.

(11) In the foregoing ferroelectric memory device, each of the plate lines extends in the first direction and may be connected to the first ferroelectric capacitors and second ferroelectric capacitors connected to the element regions arrayed on both sides of each first word line.

According to the foregoing embodiment of the invention, because each plate line is connected to the first and second ferroelectric capacitors arranged on both sides of the first word line, it is possible to provide a ferroelectric memory device having a short length in the second direction. Also, according to the foregoing embodiment of the invention, because the number of plate lines is small, the area of structures controlling plate lines can be reduced.

(12) In the foregoing ferroelectric memory device, each of the plate lines extends in the second direction—perpendicular to the first direction—and may be connected to the first ferroelectric capacitors connected to predetermined element regions and the second ferroelectric capacitors connected to other element regions adjacent to the predetermined element regions across the second word line adjacent to the predetermined element regions.

(13) In the foregoing ferroelectric memory device, the element regions are arrayed on both sides of each first word line and second word line; and each of the plate lines extends in the second direction perpendicular to the first direction and is connected to the first ferroelectric capacitors and second ferroelectric capacitors provided between the first word line and second word line, alternately.

According to the foregoing embodiment of the invention, because the respective plate lines extend in the second direction in relation to the ferroelectric memory device having a short length in the second direction, the plate lines are short and thereby reduce the loads on the plate lines.

(14) It is preferable that the foregoing ferroelectric memory device further includes a plurality of bit lines extending in the second direction—perpendicular to the first direction—and that the respective element regions are arranged to cross any of the bit lines.

(15) According to the second embodiment of the invention, provided is a ferroelectric memory device including: first, second and third word lines; first and second plate lines; first and second bit lines; a first transistor where its gate is connected to the first word line and either of its source or drain is connected to the first bit line; a second transistor where its gate is connected to the third word line and either of its source or drain is connected to the first bit line; a third transistor where its gate is connected to the first word line and either of its source or drain is connected to the second bit line; a fourth transistor where its gate is connected to the second word line and either of its source or drain is connected to the second bit line; a first ferroelectric capacitor where one of its ends is connected to the other source or drain of the first transistor and the other end is connected to the first plate line; a second ferroelectric capacitor where one of its end is connected to the other source or drain of the second transistor and the other end is connected to the second plate line; a third ferroelectric capacitor where one of its end is connected to the other source or drain of the third transistor and the other end is connected to the second plate line; and a fourth ferroelectric capacitor where one of its end is connected to the other source of drain of the fourth transistor and the other end is connected to the first plate line.

(16) The invention also provides a ferroelectric memory device including: first, second and third word lines; first, second and third plate lines; first and second bit lines; a first transistor with its gate connected to the first word line and either of its source or drain connected to the first bit line; a second transistor with its gate connected to the third word line and either of its source or drain connected to the first bit line; a third transistor with its gate connected to the first word line and either of its source or drain connected to the second bit line; a fourth transistor with its gate connected to the second word line and either of its source or drain connected to the second bit line; a first ferroelectric capacitor with one of its ends connected to the other source or drain of the first transistor and its other end connected to the first plate line; a second ferroelectric capacitor with one of its ends connected to the other source or drain of the second transistor and its other end connected to the second plate line; a third ferroelectric capacitor with one of its ends connected to the other source or drain of the third transistor and its other end connected to the second plate line; and a fourth ferroelectric capacitor with one of its ends connected to the other source or drain of the fourth transistor and its other end connected to the first plate line.

According to the second embodiment of the invention, the element regions, to which the transistors are connected, are arrayed on both sides of each word line and the word lines drive the transistors on both sides. Accordingly, it is possible to provide a ferroelectric memory device having a short length in the direction perpendicular to the direction the word lines extend.

(17) According to the third embodiment of the invention, a display drive IC including the foregoing ferroelectric memory device is provided. The display drive IC refers to devices in general, which drive display devices such as liquid crystal display devices.

(18) According to the fourth embodiment of the invention, electronic equipment including the foregoing ferroelectric memory device is provided. The electronic equipment refers to equipment in general that have the ferroelectric memory devices according to the invention and have predetermined functions. There is no limitation on the structure of the electronic devices. Examples of the electronic equipment include any and all devices requiring memory devices, such as computer devices, mobile phones, PHS, PDA, electronic organizers, and IC cards that have the foregoing ferroelectric memory devices.

DESCRIPTION OF EXEMPLARY EMBODIMENTS

Figure 1:
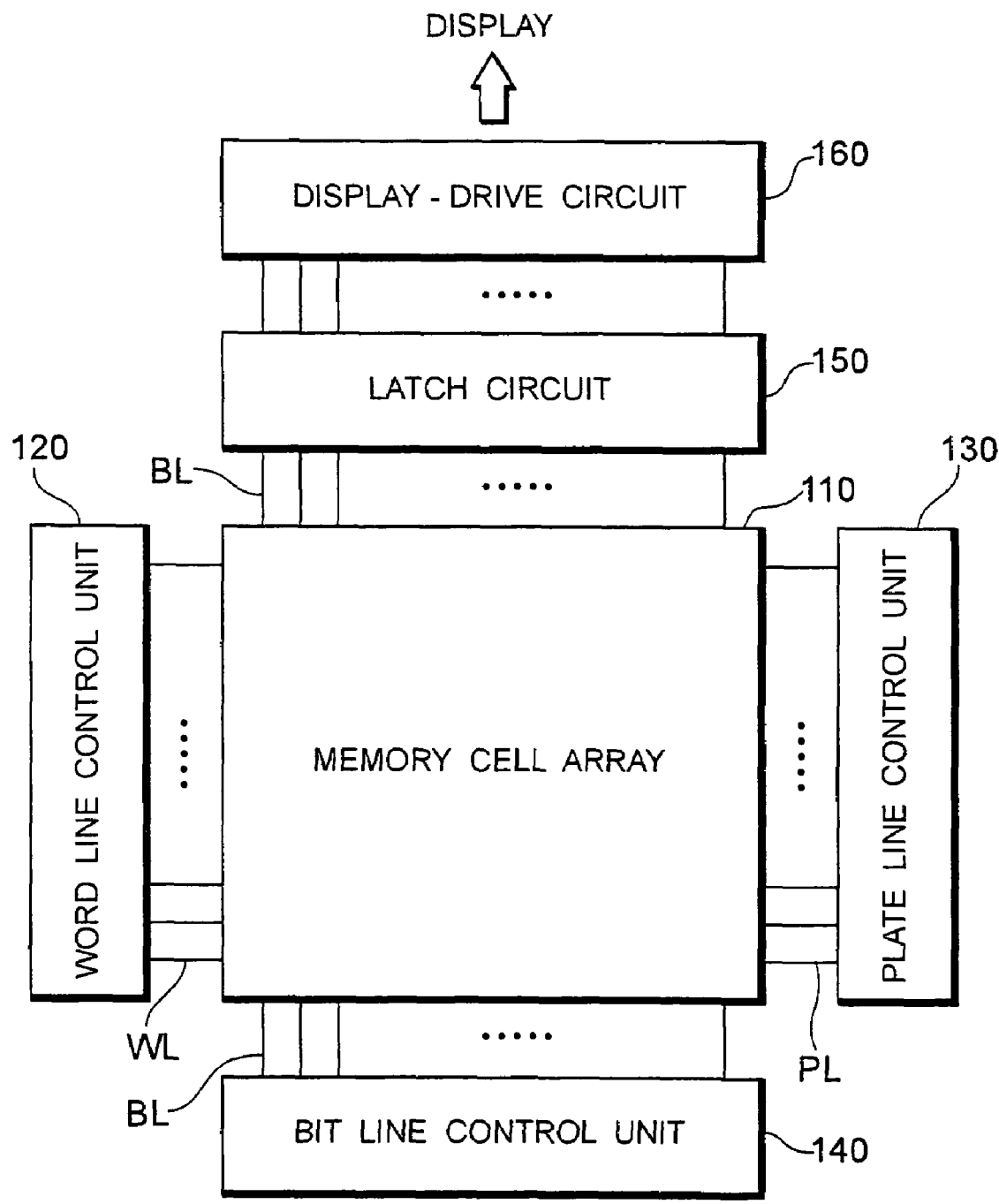
FIG. 1 is a block diagram showing the structure of a display drive IC according to Embodiment 1 of the invention.

Hereinafter, the invention will be explained by describing embodiments with reference to the drawings; however, the invention according to the scope of the claims is not be limited in any way to those embodiments. Also, not all the combinations of characteristics explained in the following embodiments are necessarily essential for achieving the goal of the invention. Incidentally, elements having the same function are given the same or relevant reference numerals and redundant explanations will be omitted.

Embodiment 1

FIG. 1 is a block diagram showing the structure of a display drive IC according to Embodiment 1. The display drive IC is formed from a FeRAM device, latch circuit 150, and display drive circuit 160. The FeRAM device is composed of a memory cell array 110, a plurality of word lines WL, a plurality of plate lines PL, a plurality of bit lines BL, a word line control unit 120, a plate line control unit 130, and a bit line control unit 140.

As will be described later, the memory cell array 110 is formed by a plurality of memory cells MC being arranged in arrays. Any one of the word lines WL, any one of the plate lines PL and any one of the bit lines BL are connected to each memory MC. The word line control unit 120 and plate line control unit 130 control the voltage of the word lines WL and plate lines PL; read data stored in the memory cells MCs to the bit lines BL; and store externally-supplied data in the memory cells MC via the bit lines BL. The latch circuit 150 latches the data read from the memory cells MC, and the display drive circuit 160 drives an external display based on the data latched by the latch circuit 150.

Here, the external display is, for example, a display device such as a liquid crystal display device. The cells constituting the display of the liquid crystal display device each have a switching transistor (thin film transistor; TFT) and pixel electrodes sandwiching a liquid crystal therebetween; and arrayed. Accordingly, in order to drive those cells (pixels), a drive IC, which is connected to the gate lines and source lines etc. of the respective TFTs, is necessary. The wiring spacing of these gate lines and source lines is often set wider than the ordinary spacing of the bit lines in a memory cell. For example, the spacing is 1 to 1.3 times wider.

Here, although it may be possible to directly connect the plurality of wires of the display to a plurality of wiring sections in the memory cell array arranged at intervals smaller than those in the display, it complicates the wiring for connection and may result in wiring connection failure. Moreover, where bit lines are formed according to the wiring pitch in the display, the problem of the wiring connection failure may be solved but the size of the memory cell array expands because the bit line spacing is set wide. For this reason, it is important to realize a technique for achieving high-level integration of a memory cell while maintaining an allowed wiring spacing.

Figure 2:
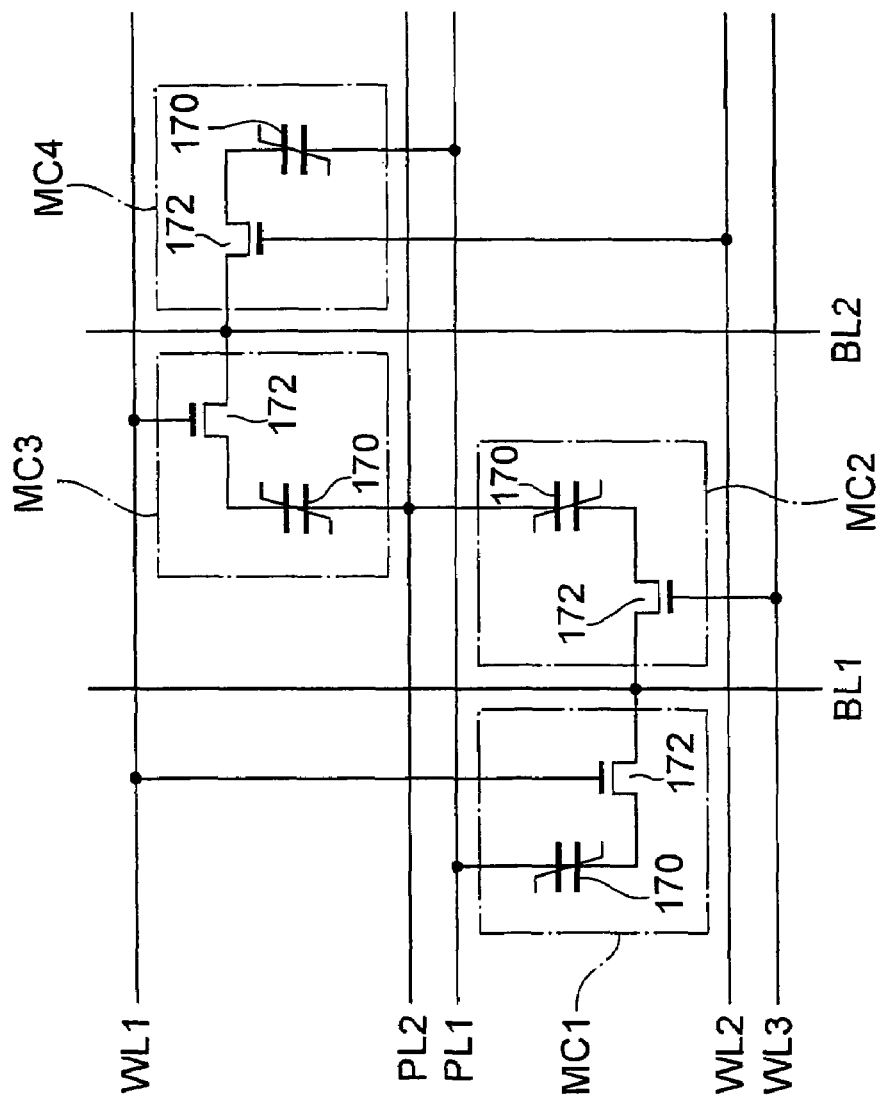
FIG. 2 is a circuit diagram showing the structure of a memory cell array 110 according to Embodiment 1.

FIG. 2 is a circuit diagram showing the structure of the memory cell array 110 according to Embodiment 1. It also shows the structure of memory cells MC1 to MC4, which are units repeated in the memory cell array 110. In the memory cell array 110, the memory cells MC1 to MC4 are repeated in the direction both the word lines WL and bit lines BL extend.

The memory cells MC1 to MC4 each have a ferroelectric capacitor 170 and NMOS (n-channel type metal oxide semiconductor (n-channel type MOS) or n-channel type metal insulator semiconductor field effect transistor (n-channel type MISFET)) 172. With the NMOS 172 in each memory cell (MC1 to MC4), one of its source/drain regions is connected to one bit line BL and the other is connected to one end of the ferroelectric capacitor 170. Incidentally, the source/drain region refers to a region that becomes a source or drain for the transistor.

The NMOS 172 has its gate connected to one word line WL and switches between connecting and disconnecting one end of the ferroelectric capacitor 170 to the corresponding bit line BL according to the voltage of the word line WL. The other end of the ferroelectric capacitor 170 is connected to corresponding plate line PL.

More specifically, in the memory cell MC1, the NMOS 172 has one of its source/drain regions connected to a bit line BL1 and its gate connected to a word line WL1; and one end of the ferroelectric capacitor 170 is connected to a plate line PL1. In the memory cell MC2, the NMOS 172 has one of its source/drain regions connected to the bit line BL1 and its gate connected to a word line WL3; and one end of the ferroelectric capacitor 170 is connected to a plate line PL2. In the memory cell MC3, the NMOS 172 has one of its source/drain regions connected to a bit line BL2 and its gate connected to the word line WL1; and one end of the ferroelectric capacitor 170 is connected to the plate line PL2. In the memory cell MC4, the NMOS 172 has one of its source/drain regions connected to the bit line BL2 and its gate connected to a word line WL2; and one end of the ferroelectric capacitor 170 is connected to the plate line PL1.

Figure 3:
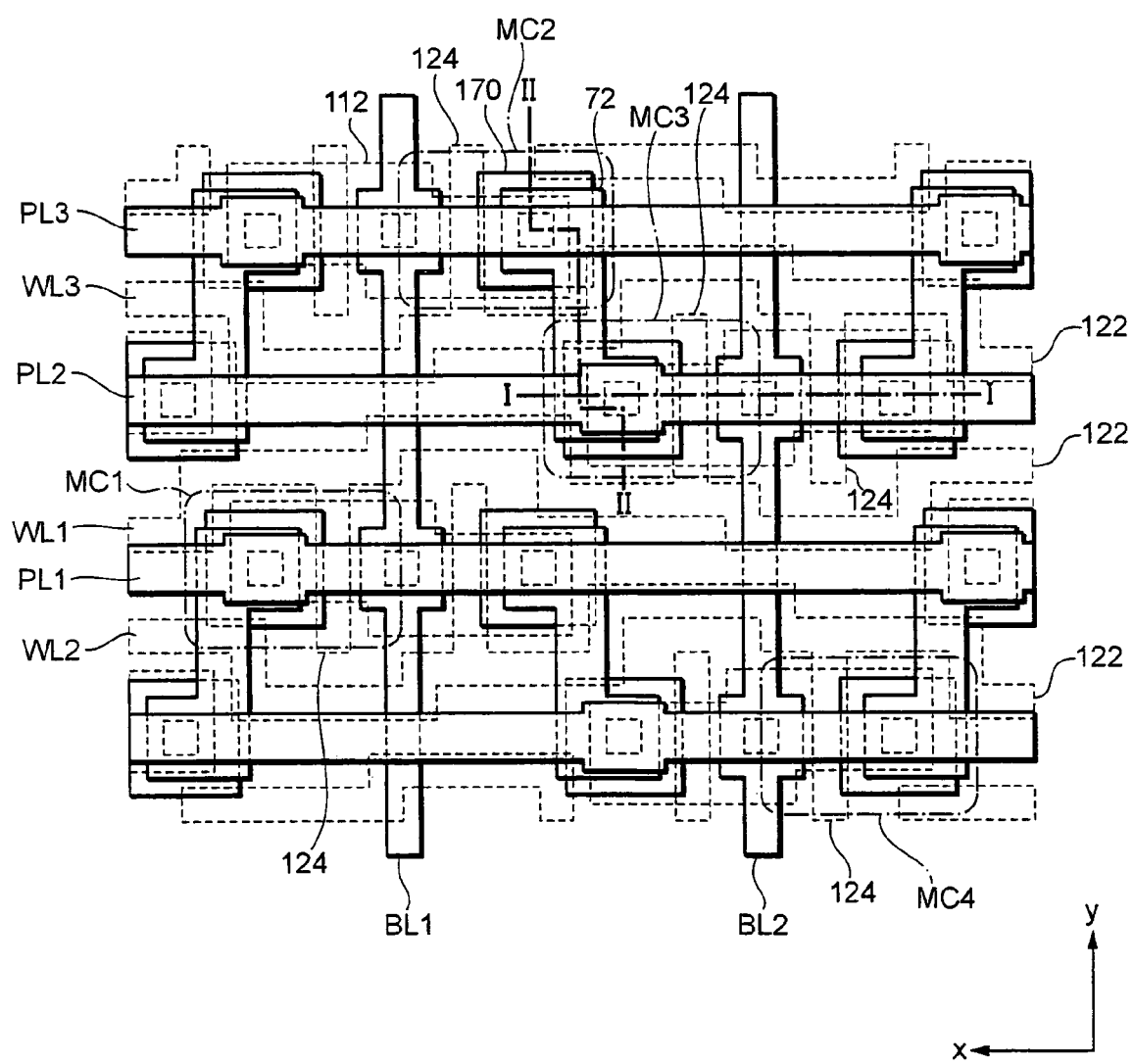
FIG. 3 is plane view of the memory cell array 110 according to Embodiment 1.
Figure 4A:
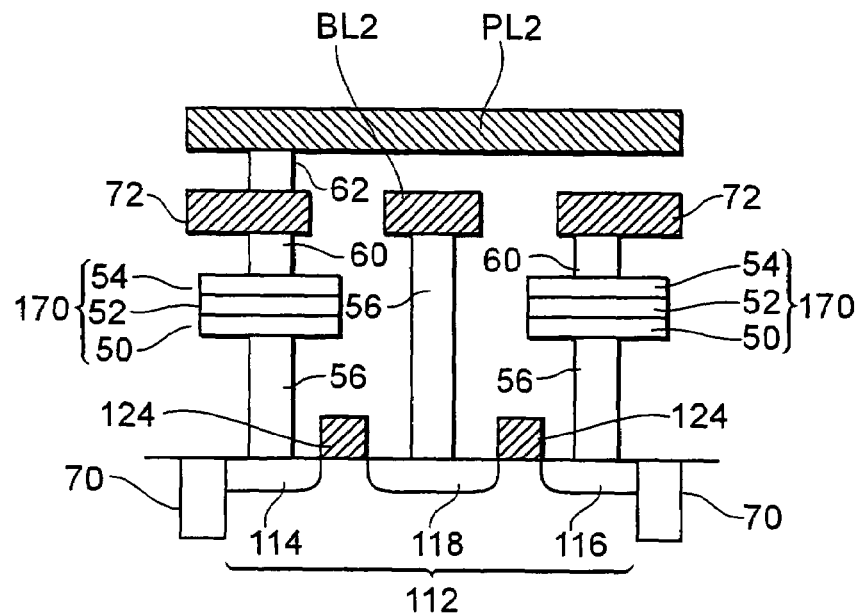
FIG. 4A is a sectional view of the major part of the memory cell array 110 according to Embodiment 1.
Figure 4B:
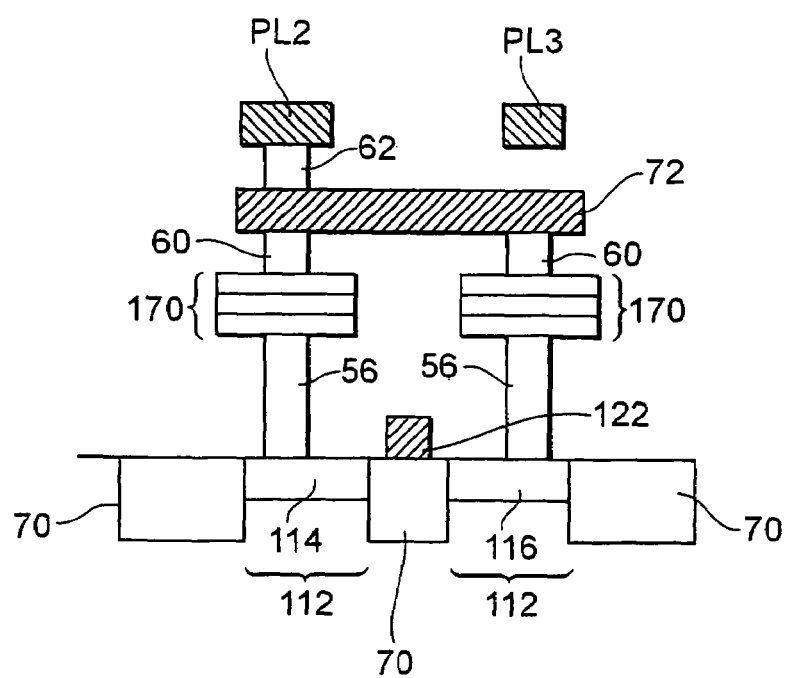
FIG. 4B is a sectional view of the major part of the memory cell array 110 according to Embodiment 1.

FIG. 3 is a plane view showing the memory cell array 110 according to Embodiment 1. FIG. 4 is a sectional view showing the major part of the memory cell array 110 according to Embodiment 1. FIG. 4A is a sectional view taken along line I-I of FIG. 3 and FIG. 4B is a sectional view taken along line II-II of FIG. 3. FIGS. 5 to 9 are plane views of the substantial part of the memory cell array 110 of FIG. 3, showing partial patterns for layout.

The structure of the memory cell array according to Embodiment 1 will be explained in detail with reference to FIGS. 3 to 9, however, major characteristics of Embodiment 1 will be explained first with reference to FIG. 10. FIG. 10 is a schematic plan view showing the memory cell array 110 according to Embodiment 1.

As shown in FIG. 10, an element region 112 is substantially rectangular, with its long sides being in the X direction. In the memory cell array 110, a plurality of element regions 112 are arranged at regular intervals in the X direction. One element region 112 has two memory cells (i.e., one element region has two transistors and two ferroelectric capacitors formed thereon.

These element regions 112 are arranged in a staggered manner. In other words, considering the element regions 112 arrayed in the X direction as element region lines, the element region line of arrangement A and the element region line of arrangement B are arranged alternately and repeated in the Y direction. A line of active regions in arrangement A refers to, for example, the element region line including the element region 112 having the memory cell MC2 formed thereon, as shown in FIG. 10. A line of active regions in arrangement B refers to, for example, the element region line (e.g., the element region line including the element region 112 having the memory cell MC3 formed thereon) arranged with its starting point not aligned with that of the element region line of arrangement A to a predetermined extent.

Here, between the respective element region lines, the main lines of word lines WL are arranged in the X direction. Each word line WL has branch lines (explained later in detail) and these branch lines extend over the element region 112 in the Y direction.

Also, bit lines BL extend in the direction perpendicular to the element regions 112 (i.e., in the Y direction) and are connected to the source/drain regions of NMOSs 172 constituting the memory cells MC.

In Embodiment 1, because two NMOSs 172 and two ferroelectric capacitors are formed on one active region 112, the bit line BL is made to cross the substantially center part of the element region 112 so that the bit line BL will be connected to the source/drain region shared by the two NMOSs 172.

In the same element region line, the memory cells MC disposed on the left side of the bit line BL are connected the same word line WL (the word line WL positioned above these memory cells MC in the FIG. 10) while the memory cells MC disposed on the right side of the bit line BL are connected to the other same word line WL (the word line WL positioned below these memory cells MC in FIG. 10).

In other words, the word line WL sandwiched by the element region lines is connected to, from among the memory cells MC formed on the element regions 112 provided on both sides (i.e., top and bottom sides in FIG. 10) of the word line WL, the memory cells MC provided at one side (e.g., left-side memory cells MC in FIG. 10) of each element region 112. The word line WL adjacent to the foregoing word line WL, is connected to, from among the memory cells MC formed on the element regions 112 provided on both sides (i.e., top and bottom sides in FIG. 10) of the word line, the memory cells MC provided on the other side (e.g., right-side memory cells MC in FIG. 10) of each element region 112.

In other words, the memory cells (e.g., MC2 and MC3) adjacent to one another between the same two bit lines BL are driven by different word lines WL.

The major characteristics of Embodiment 1 are summarized below.

The first characteristic is that the element regions 112 are arranged so that their longitudinal direction is perpendicular to the bit lines BL (i.e., the element regions 112 are arranged in the X direction parallel to the word lines WL). Also, the memory cell lines are provided on both sides of each bit line BL. The memory cell lines refer to the lines of memory cells arranged in the Y direction. For example, on both sides of each bit line BL, the memory cell line including the memory cell MC2 and the memory cell line including memory cell MC1 are provided. Also, between the bit lines BL, the memory cell line including memory cell MC2 and the memory cell line including the memory cell MC3 are arranged.

Thus, according to Embodiment 1, the memory cells can be efficiently arranged between the bit lines BL. Particularly when the space between the bit lines BL is wider than usual, the memory cells can be arranged efficiently.

The second characteristic of Embodiment 1 is that the word lines WL have branch lines, which are connected to the memory cells in element regions 112. Even when the longitudinal direction of the element regions 112 is parallel to the word lines WL, the memory cells can be driven via the branch lines of the word lines WL.

The third characteristic according to Embodiment 1 is that the element regions 122 are arranged in a staggered manner as described above. With the staggered arrangement, the spacing in the Y direction between the element regions 122 can be reduced. Moreover, the staggered arrangement helps to secure areas for the word lines (branch lines) WL.

The fourth characteristic of Embodiment 1 is that, with the newly-devised connection between the respective memory cells and the word lines WL, the spacing between the element regions can be reduced further by (1) bending the extending word lines or (2) by forming the element regions in a "z" shape. Consequently, the arrangement of the respective memory cells can be optimized.

Next, the structure of the memory cell array according to Embodiment 1 will be explained in detail with reference to FIGS. 3 to 9. Incidentally, to make it easy to understand the drawings, hatching is provided even for plane views as appropriate.

As shown in FIG. 3 and others, the memory cell array 110 has a plurality of element regions 112, word lines WL, plugs, ferroelectric capacitors 170, bit lines BL and plate lines PL arranged thereon.

Figure 5:
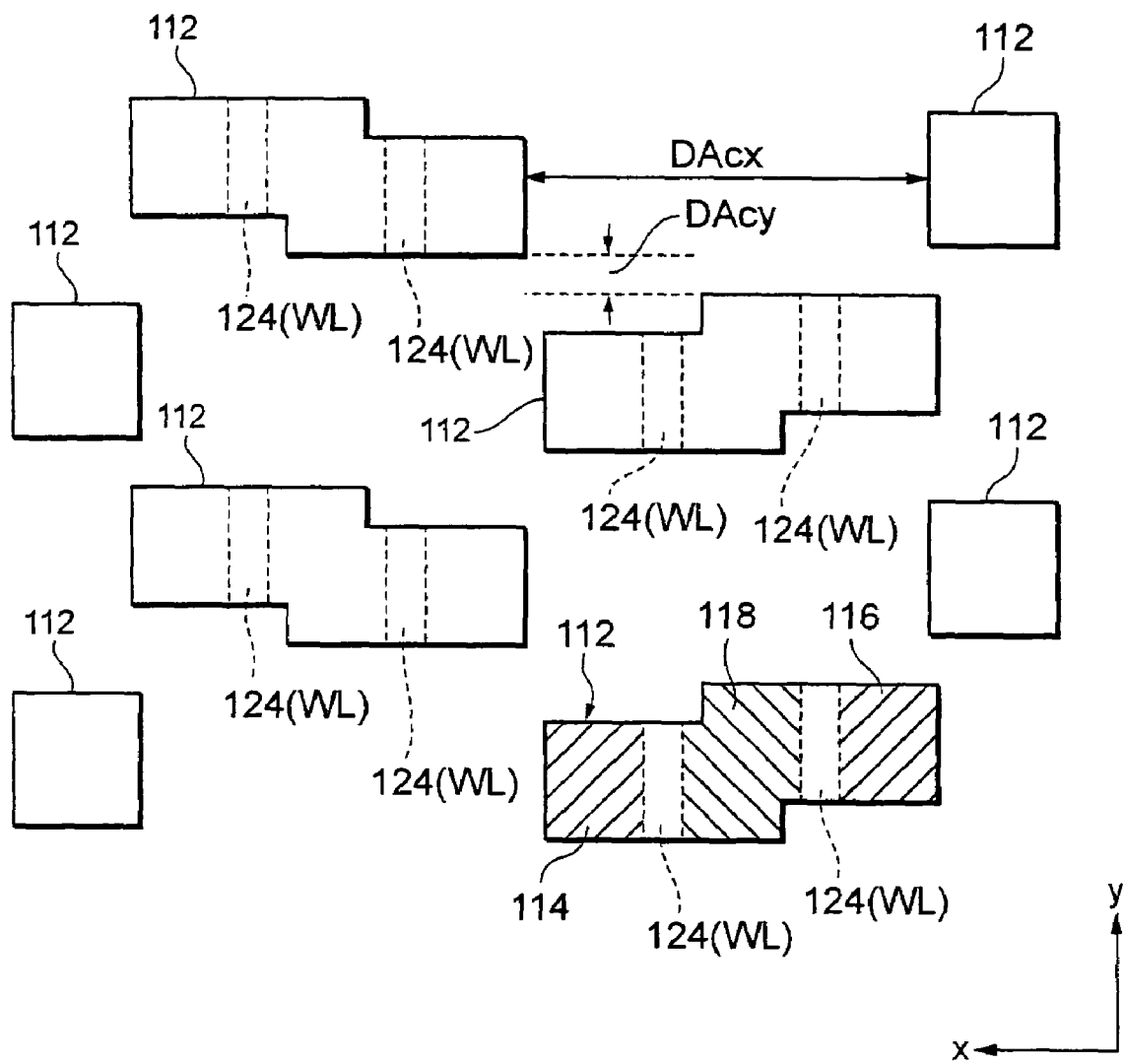
FIG. 5 is a plane view of the major part of the memory cell array 110 according to Embodiment 1, showing partial patterns.

(1) As shown in FIG. 5, the element regions 112 are long regions extending in the X direction and, in Embodiment 1, they are in a substantially Z shape (or inverted-Z shape). The element regions 112 are arrayed in the X direction and the distance between them is DAcx. On the other hand, the distance between the element regions 112 adjacent to one another in the Y direction is DAcy. The element regions 112 are arranged in a zigzag format in the X direction so that they form two element-region lines adjacent to each other. In other words, the element regions 112 are arranged in a staggered manner. In FIG. 5, the respective element regions 112 are arranged to not overlap one another in the X direction.

These element regions 112 are the areas where NMOSs 172 (see FIG. 2) constituting memory cells MC1 to MC4 are formed. In each element region 112, two NMOSs 172 (branch lines 124 of a word line WL) are formed. As shown in the bottom right part of FIGS. 4 and 5, the element region 112 has active regions 114, 116 and 118, which are examples of one end, the other end and the middle part. In the element region 112, the active regions 114, 116 and 118 are the source/drain regions for the NMOSs 172 and function as sources or drains. Moreover, the branch lines 124 of each word line WL function as gates for the NMOS 172s. The element regions 112 are insulated (isolation) from each other via an insulating layer 70 (see FIG. 4).

Here, the element regions 112 have a substantially Z shape (or an inverted Z shape). In other words, as shown in the element region 112 in the bottom right part of FIG. 5, the width of the active region 118 in the Y direction is wider than the widths of the active regions 114 and 116 in the same direction. More specifically, with the element region 112, its longitudinal direction is in the X direction and the element regions has a stair-like shape in the Y direction. In other words, in the element region 112, the active regions 114 and the active regions 116 are misaligned and arranged in different directions as seen from the Y direction.

Figure 10:
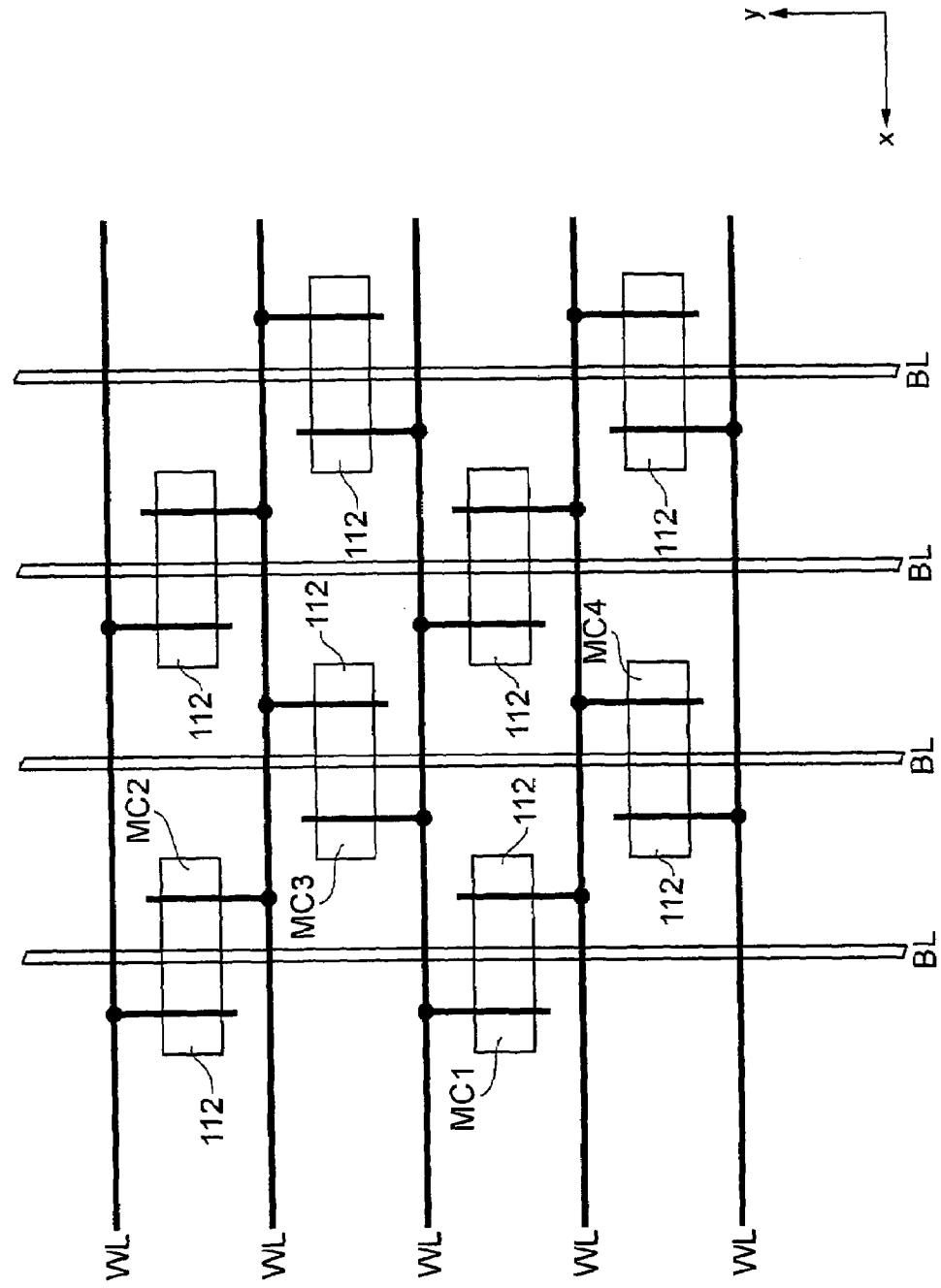
FIG. 10 is a schematic plan view showing the memory cell array 110 according to Embodiment 1.
Figure 11A:
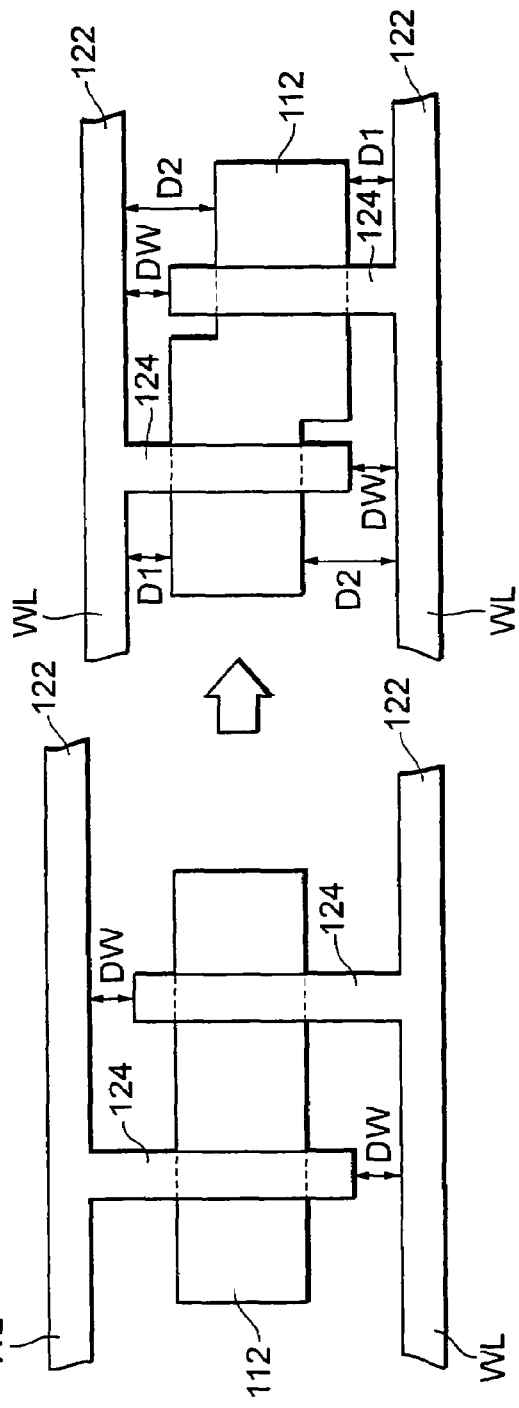
FIG. 11A is a partial plane view explaining the effects of Embodiment 1.
Figure 11B:
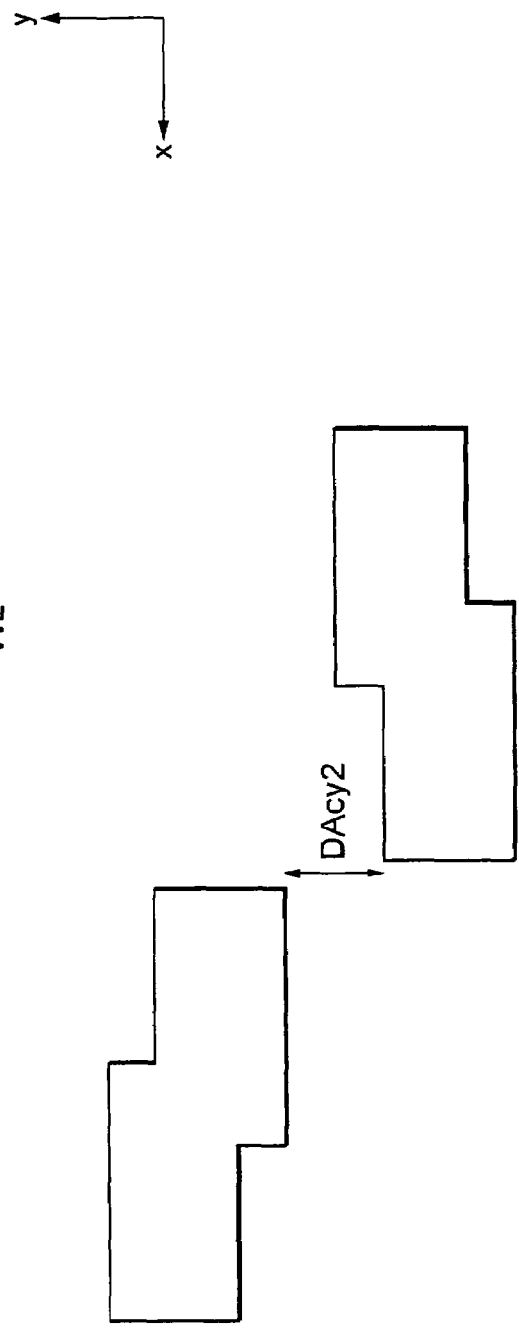
FIG. 11 B is a partial plane view explaining the effects of Embodiment 1.

By inventing the shape of the element regions 112, the spacing in the Y direction between the element regions 112 can be reduced. As explained with reference to FIG. 10, if the element regions 112 have a substantially rectangular shape, it is necessary to ensure, in the Y direction, a wide spacing between the element regions. This is because, as shown in FIG. 11A, a distance (DW) has to be ensured between the branch lines 124 of a word line WL and the main line 122 of another word line WL adjacent to the foregoing word line WL. FIG. 11A and FIG. 11B are a partial plane view explaining the effects of Embodiment 1.

As shown in FIG. 11A, by bending one end of the element region 112 in the direction of the word line WL driving the element region 112 so that the element region 112 assumes a crank shape, the distance between the branch lines 124 of the word line WL 124 and the main line 122 of another word line WL adjacent to the foregoing word line WL 124 becomes large, making it possible to reduce the distance between the word lines WL and the element region 112. Consequently, the spacing in the Y direction between the element regions 112 can be reduced. In other words, the memory cell formed on one end of the element region 112 is disposed close to the main line 122 of the word line WL driving the element region 112, and the distance between the memory cell and the main line 122 is D1. On the other hand, the memory cell is disposed with a distance D2 (D2>D1) away from the main line 122 of the other word line WL that does not drive the memory cell.

Also, as shown in FIG. 11B, with the adjacent element regions 112, the parts of the element regions 112 close to each other are bent in the same direction to secure the distance (DAcy2) between the element regions 112. In other words, regarding the element regions 112 arrayed on one side of each word line WL (e.g., the element region 112 having the memory cell MC2 formed thereon) and the element regions 112 arrayed on the other side (e.g., the element region 112 having the memory cell MC3 formed thereon), the active regions 114 and active regions 116 are misaligned in opposite directions. To put it another way, the element regions 112 arrayed on one side of each word line WL (e.g., the element region 112 having the memory cell MC2 formed thereon) are in a substantially Z shape while the element regions 112 arrayed on the other side (e.g., the element region having the memory cell MC3 formed thereon) are in an inverted-Z shape.

By inventing the shape and arrangement of the element regions 112 as above, the spacing in the Y direction between the element regions 112 can be reduced.

Also, the element regions 112 are arrayed in the X direction, each array being sandwiched by the adjacent word lines WL. In other words, in the memory cell array 110, the word lines WL and the line of element regions 112 are arranged alternately in the Y direction. Also, the element regions 112 are arranged on both sides of each word line WL alternately in a zigzag format in the X direction. That is to say, the element regions 112 are arranged in a staggered manner. In Embodiment 1, the element regions 112 arrayed on one side of each word line WL and the element regions 112 arrayed on the other side are disposed not to overlap each other in the X direction.

Figure 6:
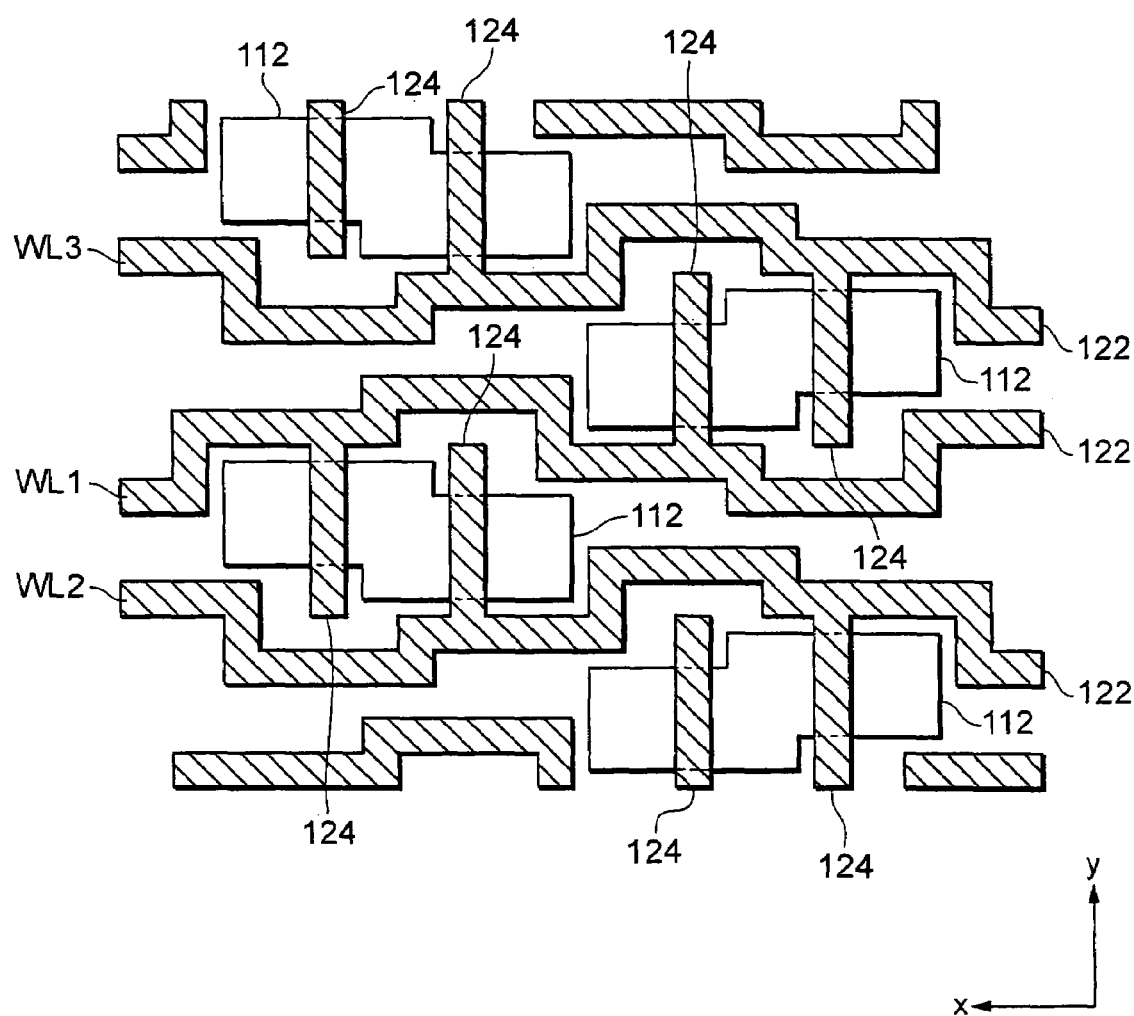
FIG. 6 is a plane view of the major part of the memory cell array 110 according to Embodiment 1, showing partial patterns.

(2) As shown in FIG. 6, each word line WL consists of a main line 122 substantially extending in the X direction; and branch lines 124 extending in the Y direction perpendicular to the X direction, and the word line WL extends in the X direction as a whole. The main line 122 repeatedly bends between the element regions 112 adjacent to the main line 122 while extending in the X direction. More specifically, the main line 122 bends in both the X and Y directions according to the shapes and arrangement of the element regions 112 adjacent to the main line 122 such that it extends through the area lies between the element regions 112.

The main line 122 also bends according to the arrangement of the branch lines 124 of other word lines WL adjacent to the main line 122. More specifically, each branch line 124 is branched from a main line 122 and extends through an element region 122 in the Y direction from one side of the element region 112 to the other side, with its end protruding from the element region 112. This is because the driving performance of the transistor can be improved by using the entire width of the element region 112 in the Y direction as a channel. Also, with the protruding section, defects such as mask misalignment and manufacture irregularity can be reduced.

In the element region 112, the branch lines 124 run between the active regions 114 and 118 as well as between the active regions 116 and 118 (see FIG. 4), which will be described later, with its ends protruding from the element region 112. The main line 122 bends so as to be arranged a predetermined distance away from the branch lines 124 of other word lines WL adjacent to the main line 122.

Figure 12:
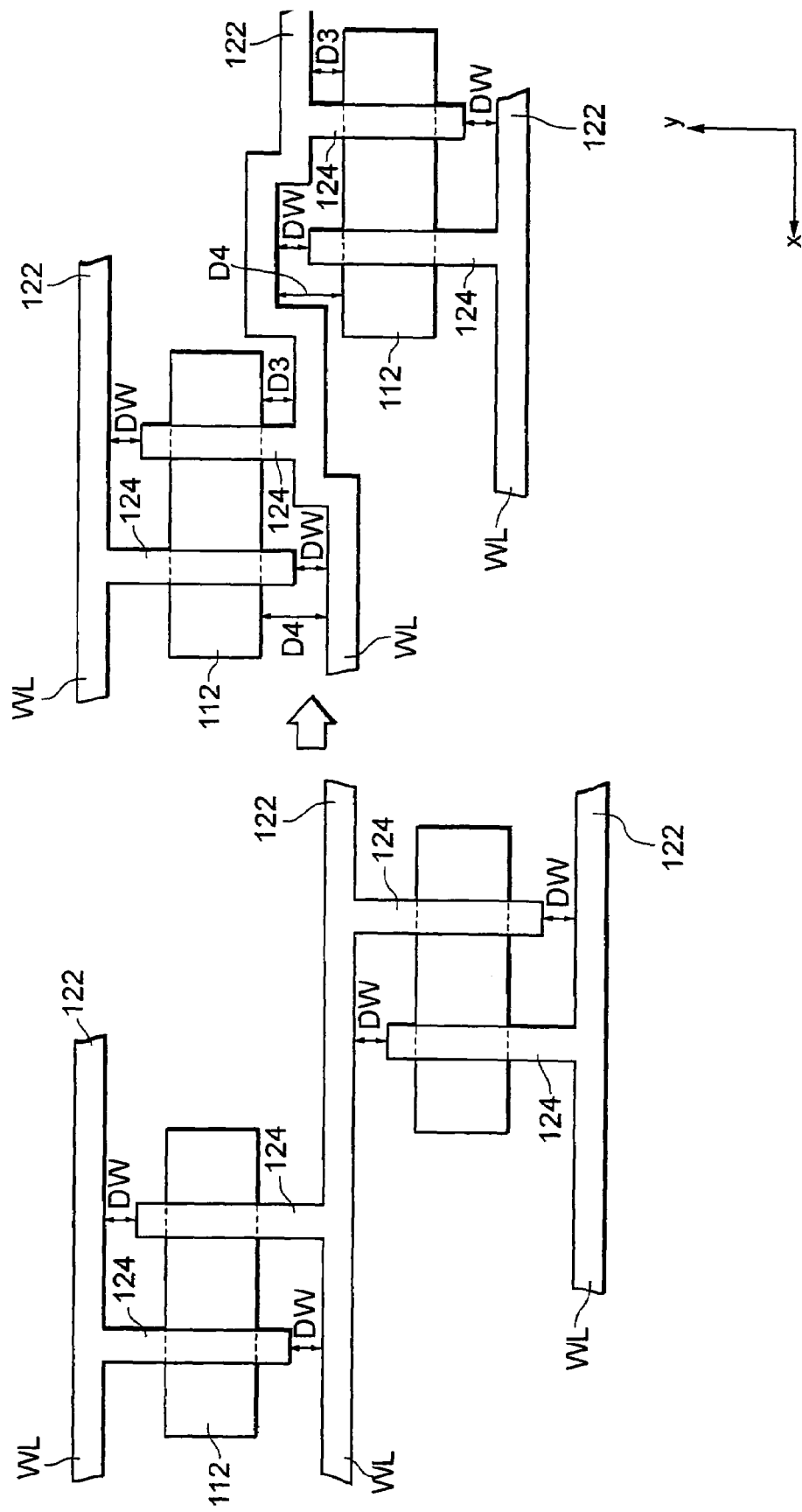
FIG. 12 is a partial plane view explaining the effects of Embodiment 1.

With a word line WL extending between the element regions 112 while being bent, the spacing in the Y direction between the element regions 112 can be reduced. As explained with reference to FIG. 10, if the element regions 112 are substantially rectangular, the spacing in the Y direction between the element regions 112 has to be wide. This is because it is necessary to secure a distance (DW) between the branch lines 124 of a word line WL and the main line 122 of another word line WL. FIG. 12 is a partial plane view explaining the effects of Embodiment 1.

As shown in FIG. 12, the main line 122 of a word line WL is disposed close to the side of the element region 112 from which a branch line 124 of the main line 122 extends, i.e., the main line 122 is arranged a distance D3 (<D4) away from the side of the element region 112. On the other hand, it is arranged away from the side of the element region 112 that faces the branch line 124 of another word line WL, i.e., the main line 122 is arranged a distance D4 (>D3) away from the other side of the element region 112.

Thus, with the main line 122 of a word line WL bent to alternately approach and move away from the element regions 112 arranged on both sides of the word line WL, the spacing between the word line WL and the element regions 112 can be reduced. As a result, the distance in the Y direction between the element regions 112 can be reduced.

Figure 7:
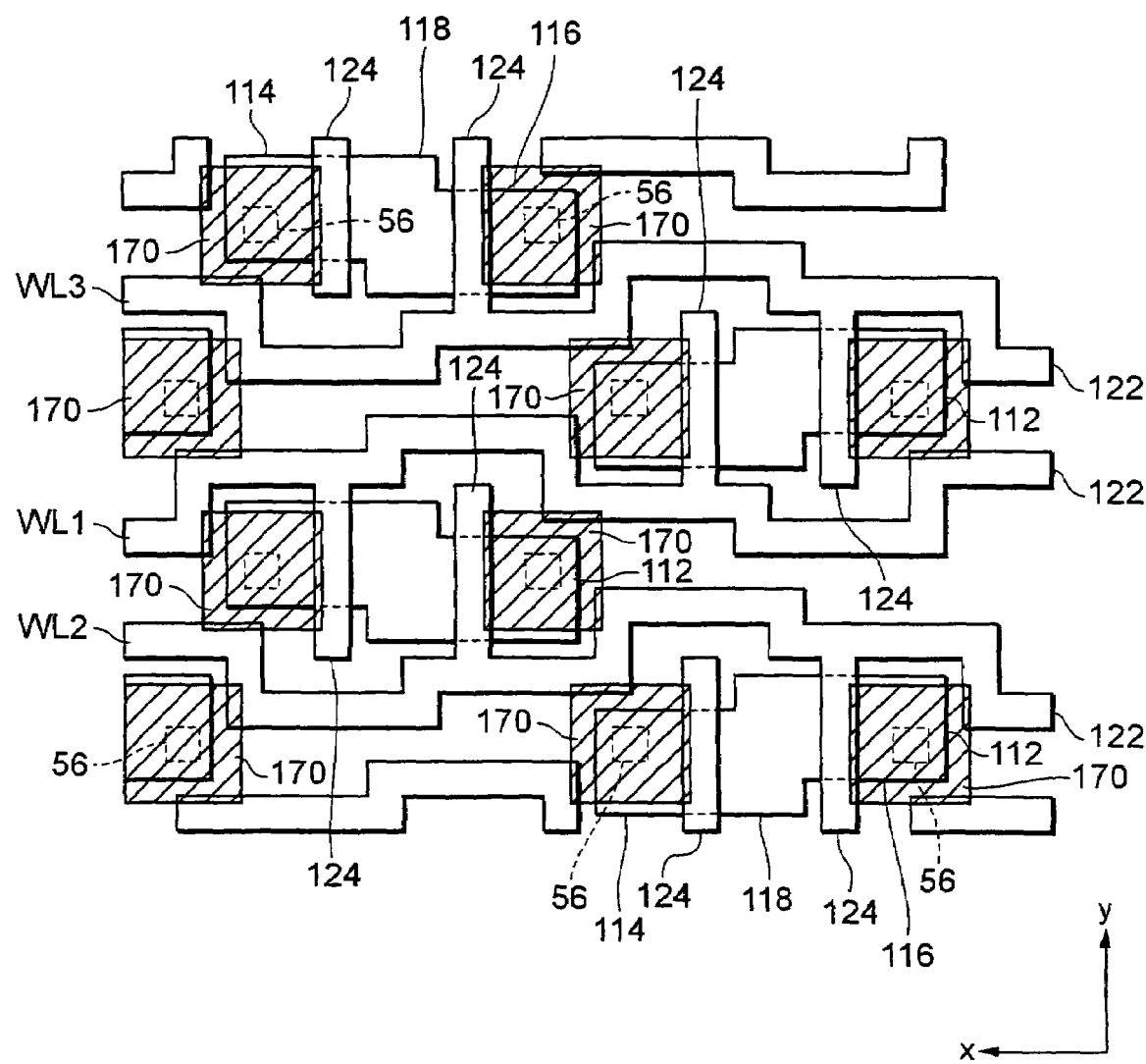
FIG. 7 is a plane view of the major part of the memory cell array 110 according to Embodiment 1, showing partial patterns.

(3) As shown in FIG. 7, ferroelectric capacitors 170 are formed on both ends (active regions 114 and 116) of an element region 112 (see also FIGS. 4 and 5). As shown in FIG. 4, the ferroelectric capacitors 170, each having a laminated structure consisting of a lower electrode 50, ferroelectric layer 52, and upper electrode 54, are respectively provided on both ends of the element region 112 in the X direction. The lower electrodes 50 in the ferroelectric capacitors 170 are connected to the active regions 114 and 116 respectively via a plug 56.

In Embodiment 1, for the memory cell arrays 110, a word line WL for driving the ferroelectric capacitors 170 connected to the active regions 114, and a word line WL for driving the ferroelectric capacitors 170 connected to the active regions 116, are arranged alternately. A plurality of branch lines 124 branching from predetermined word lines WL are arranged to drive only the ferroelectric capacitors 170 connected to either of the active regions 114 or 116 (see FIGS. 4 and 7). In FIG. 3, the word line WL1 drives the ferroelectric capacitors 170 connected to the active regions 114 and the word lines WL2 and WL3 adjacent to the word line WL1 are arranged to drive the ferroelectric capacitors 170 connected to the active regions 116. Incidentally, the branch lines 124 may be arranged to drive the ferroelectric capacitors 170 connected to both the active regions 114 and 116.

Figure 8:
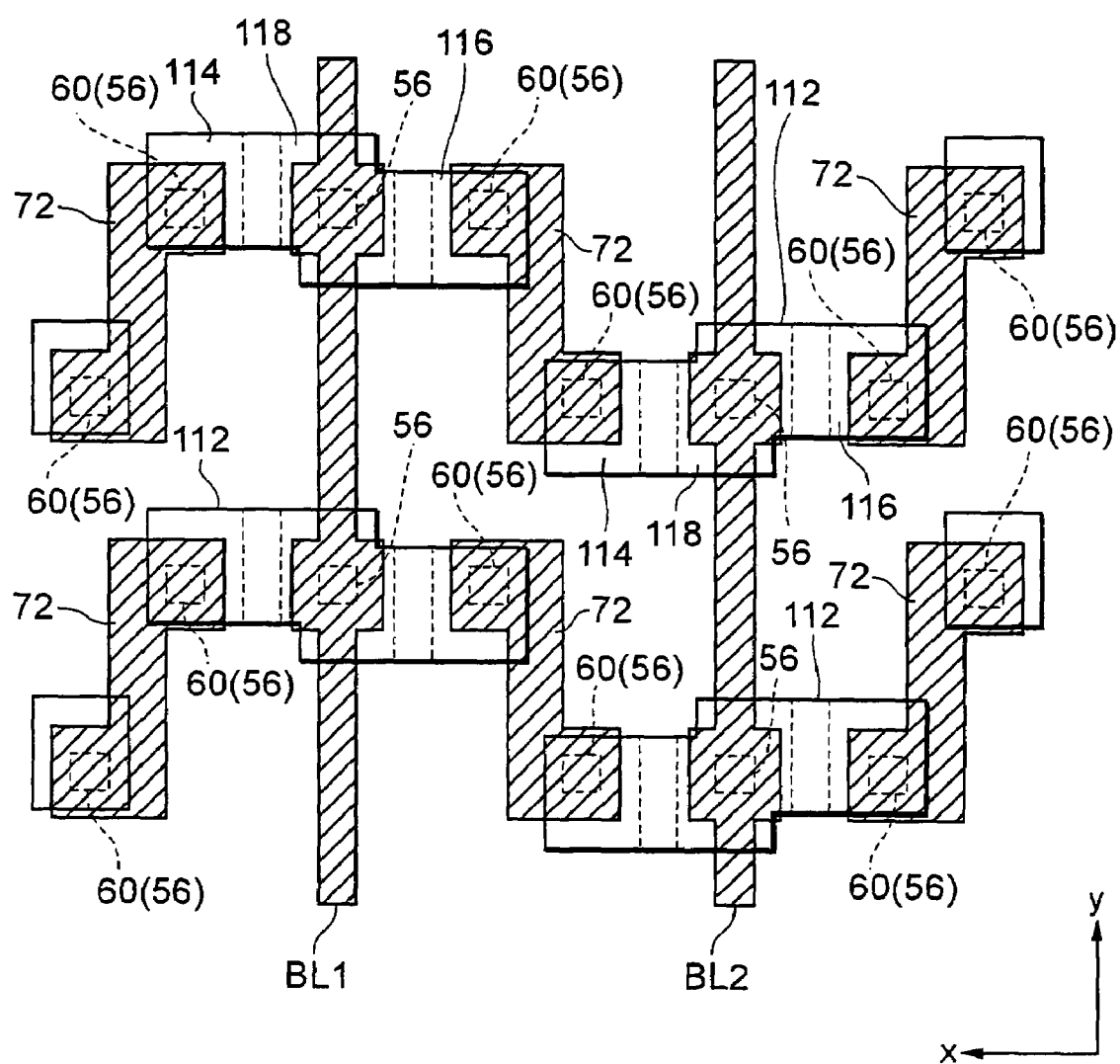
FIG. 8 is a plane view of the major part of the memory cell array 110 according to Embodiment 1, showing partial patterns.

(4) As shown in FIG. 8, the respective bit lines BL extend substantially straight in the Y direction, at regular intervals in the X direction. As previously described, the element regions 112 are arranged on both sides of each word line WL alternately in a zigzag format in the X direction and they intersect with the bit lines BL as shown in FIG. 8. As shown in FIG. 4, the respective bit lines BL are connected to the active regions 118 of element regions 112 via the plugs 56. In the respective NMOSs 172, when a predetermined voltage is supplied to the branch lines 124 (word lines WL), channels are formed below the branch lines 124 in the active regions 112 and the bit lines BL and the lower electrodes 50 of the ferroelectric capacitors 170 are connected.

Also, as shown in FIG. 8, wires 72 are provided on the same level as the bit lines BL and extend from the active regions 114 of predetermined element regions 112 to the active regions 116 of other element regions 112 adjacent to the active regions 114. Further, as shown in FIG. 4B, the wires 72 connect the ferroelectric capacitors 170 connected to the active regions 114 with the ferroelectric capacitors 170 connected to the active regions 116 of other element regions 112 adjacent to the active regions 114. In other words, the wires 72 are connected to the upper electrodes 54 of each ferroelectric capacitor 170 via plugs 60.

Figure 9:
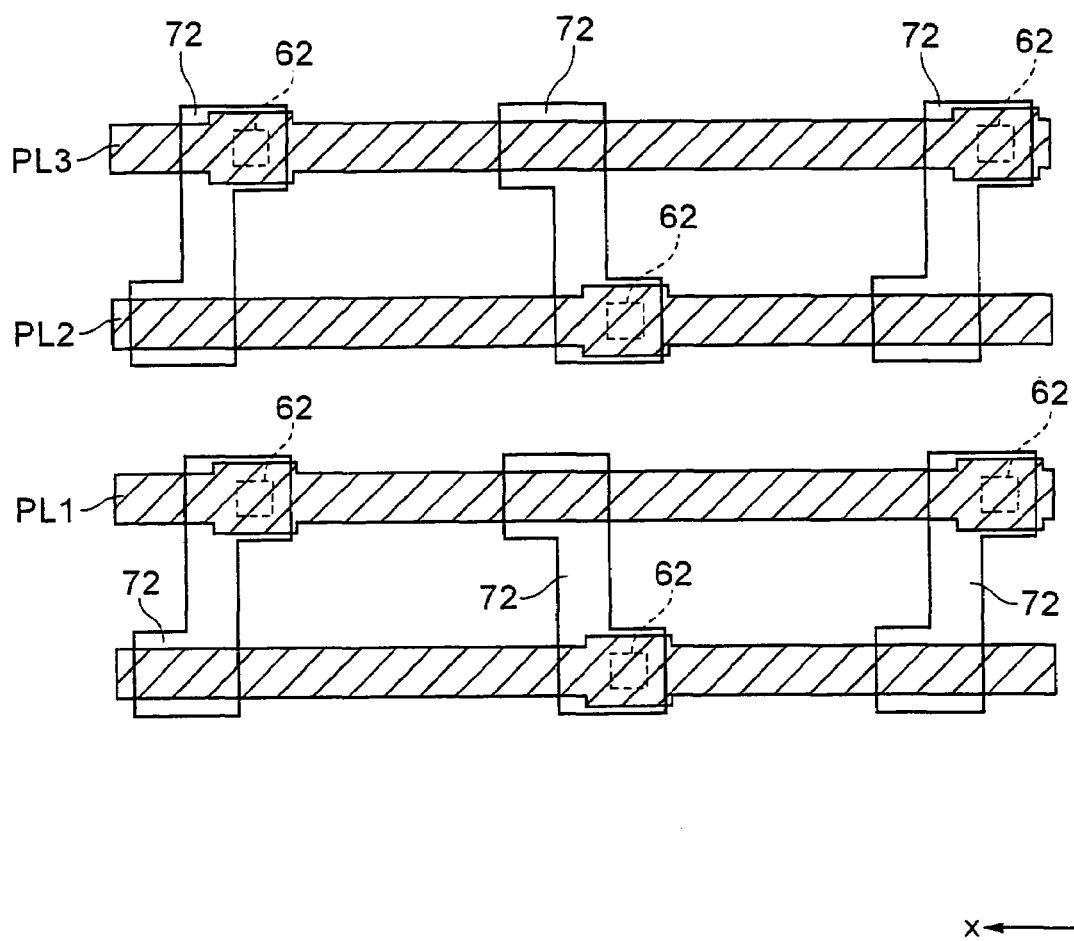
FIG. 9 is a plane view of the major part of the memory cell array 110 according to Embodiment 1, showing partial patterns.

(5) As shown in FIGS. 3, 4 and 9, the respective plate lines PL extend substantially straight in the X direction at regular intervals in the Y direction. The plate lines PL are arranged along the arrays of element regions 112 so that they overlap the element regions 112. Each plate line PL is connected only to the ferroelectric capacitors 170 connected to the active regions 114 from among the ferroelectric capacitors 170 positioned on the level below the plate line PL; and is also connected only to the ferroelectric capacitors 170 connected to the active regions 116 from among the ferroelectric capacitors 170 positioned on the level below another plate line PL adjacent to the foregoing plate line PL. In other words, the ferroelectric capacitors 170 connected to the active regions 114 provided on one side of a predetermined word line WL and the ferroelectric capacitors 170 connected to the active regions 116 provided on the other side of the predetermined word line WL are connected to the same plate line PL.

As explained above, according to Embodiment 1, because each word line WL drives the ferroelectric capacitors 170 connected to the element regions 112 arranged on both sides of the word line WL, it is possible to provide a FeRAM device having a short length in the Y direction. Particularly, the FeRAM device according to Embodiment 1 has its length in the Y direction shorter than that of a FeRAM device where element regions 112 are arrayed on both sides of each bit line BL.

According to Embodiment 1, at least two ferroelectric capacitors 170 are connected to a predetermined element region 112, and word lines WL for driving the respective ferroelectric capacitors 170 are arranged on both sides of the predetermined element region 112, so a FeRAM device achieving high-level integrity and having a short length in the Y direction can be provided.

According to Embodiment 1, a plurality of element regions 112 are arranged on both sides of each word line WL alternately in a zigzag format in the X direction, so a FeRAM device where the distance between the element regions 112 in the Y direction is small and the length of the FeRAM in the Y direction is short can be provided.

According to Embodiment 1, because it is possible to secure wide channels for the NMOSs 172 formed in the element regions 112, even if the length in the Y direction is short, sufficient driving performance for the NMOSs 172 can be ensured. Consequently, sufficient speed in accessing the ferroelectric capacitors 170 can be ensured.

According to Embodiment 1, even though the distance in the Y direction between the element regions 12 is small, each element region 112 has enough width. Accordingly, the NMOSs 172 formed on the element regions 112 can have sufficient driving performance. As a result, sufficient speed in accessing the ferroelectric capacitors 170 can be ensured.

According to Embodiment 1, because the respective word lines WL are bent, the distance in the Y direction between the element regions 112 can be further reduced, which enables the provision of a FeRAM device having a short length in the Y direction.

According to Embodiment 1, because a plurality of ferroelectric capacitors 170 connected to the same plate line PL are driven by different word lines WL, it is possible to provide a FeRAM device having a short length in the Y direction and being able to access predetermined ferroelectric capacitors 170.

According to Embodiment 1, with the structure where a plurality of ferroelectric capacitors 170 that are connected to the same plate line PL are driven by different word lines WL, each plate line PL can be arranged substantially straight, so the loads on the plate lines PL can be reduced.

Embodiment 2

Figure 13:
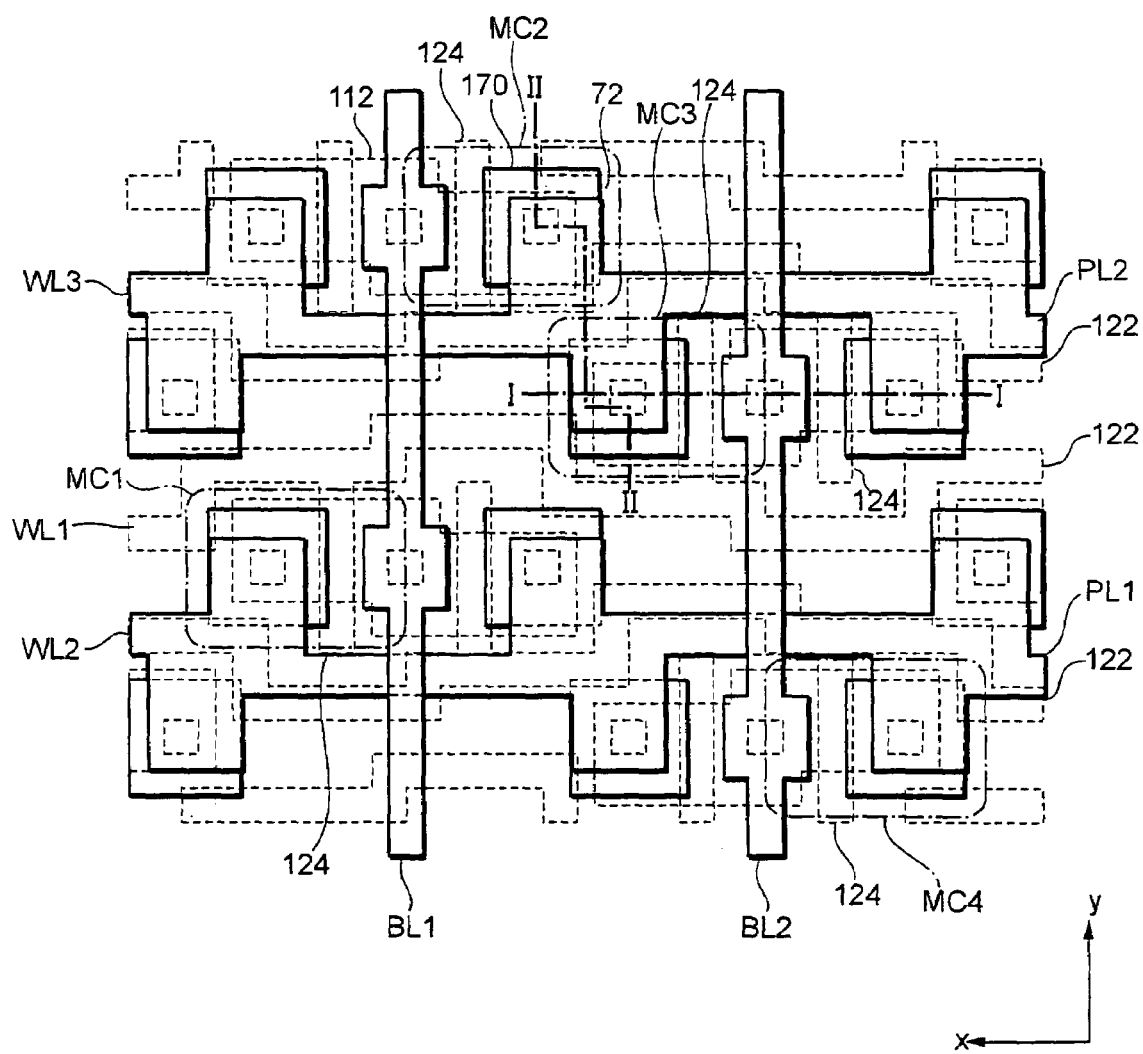
FIG. 13 is a plane view showing a memory cell array 110 according to Embodiment 2.
Figure 14A:
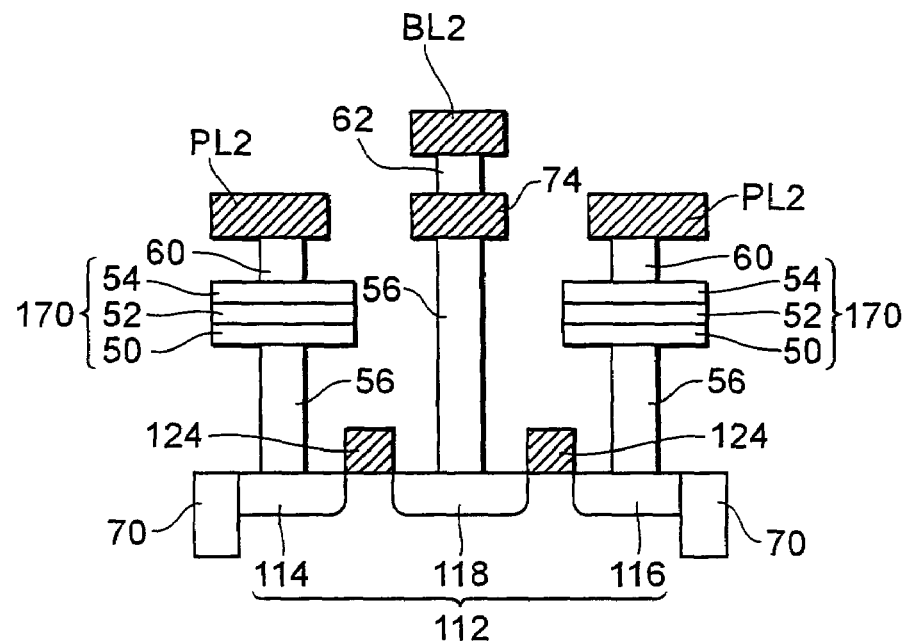
FIG. 14A is a sectional view of the major part of the memory cell array 110 according to Embodiment 2.
Figure 14B:
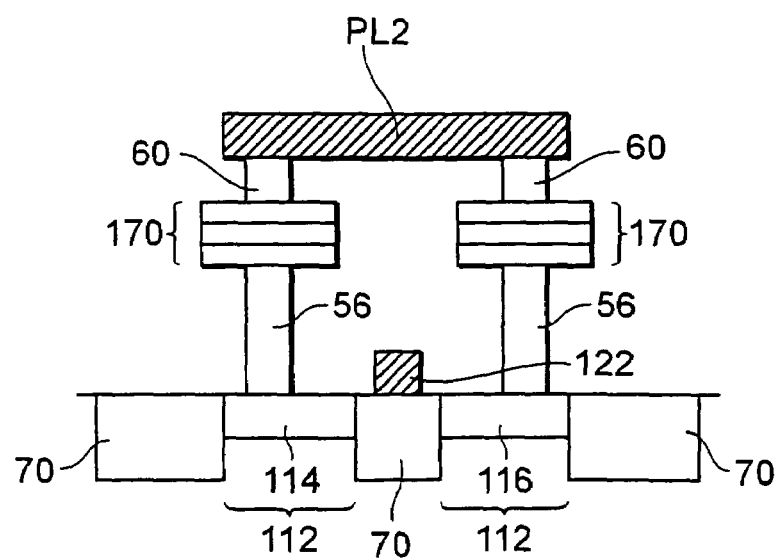
FIG. 14B is a sectional view of the major part of the memory cell array 110 according to Embodiment 2.

FIG. 13 is a plane view showing a memory cell array 110 according to Embodiment 2. FIG. 14 is a sectional view of the major part of the memory cell array 110 according to Embodiment 2. FIG. 14A shows a cross section taken along line I-I of FIG. 13 and FIG. 14B shows a cross section taken along line II-II of FIG. 13. In the following explanation, the same reference numerals are given to the elements corresponding to those in Embodiment 1; accordingly, detailed explanations for them are omitted and only differences from Embodiment 1 will be explained.

In Embodiment 2, as shown in FIG. 13, the respective plate lines PL extend in the X direction and are connected to the ferroelectric capacitors 170 connected to the element regions 112 arranged on both sides of word lines WL. More specifically, the plate lines PL are provided in a ratio of two word lines WL to one plate line PL and connected to the ferroelectric capacitors 170 connected to the active regions 114 and 116 arranged on both sides of the corresponding word lines WL.

According to Embodiment 2, as shown in FIG. 14, the bit lines BL are provided on the level above the plate lines PL. More specifically, the plate lines PL are connected to the upper electrodes 54 of the ferroelectric capacitors 170 via the plugs 60 while the bit lines BL are connected to the active regions 118 via the pads 74 provided on the same level as the plate lines PL, the plugs 56 and the plugs 62.

Also, according to Embodiment 2, because the respective plate lines PL are connected to the ferroelectric capacitors 170 arranged on both sides of each word line WL, a FeRAM device having, in addition to the effects of Embodiment 1, a length in the Y direction shorter than that in Embodiment 1 can be obtained. Also, according to Embodiment 2, because the number of plate lines PL can be reduced, the area for the structure of the plate line control unit can also be reduced (see FIG. 1).

Incidentally, Embodiment 2 has been explained for the case where the bit lines BL are positioned on the level lower than the plate lines PL, however, the bit lines BL may also be positioned on a level higher than the plate lines PL.

Embodiment 3

Figure 15:
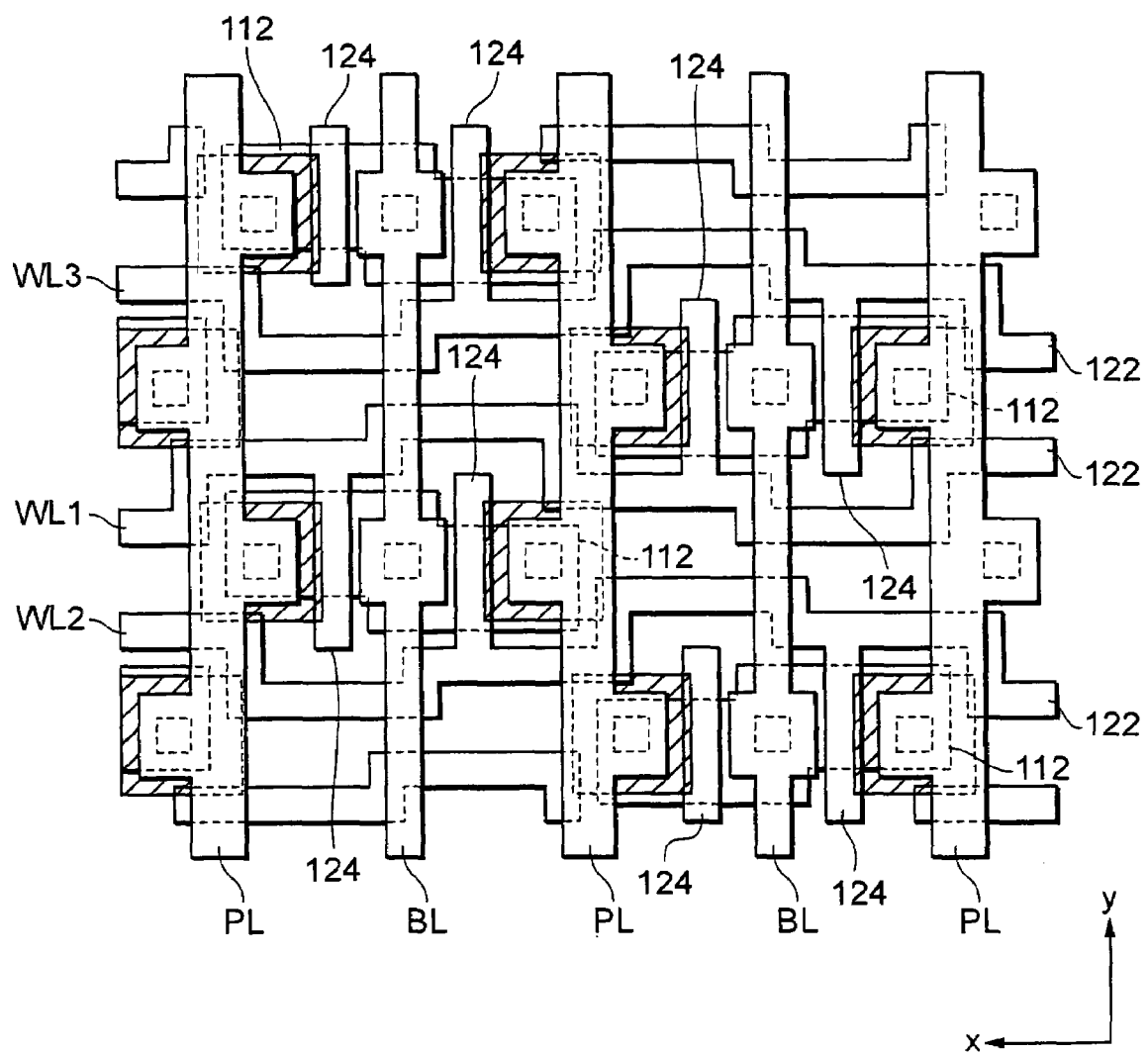
FIG. 15 is a plane view showing a memory cell array 110 according to Embodiment 3.
Figure 16:
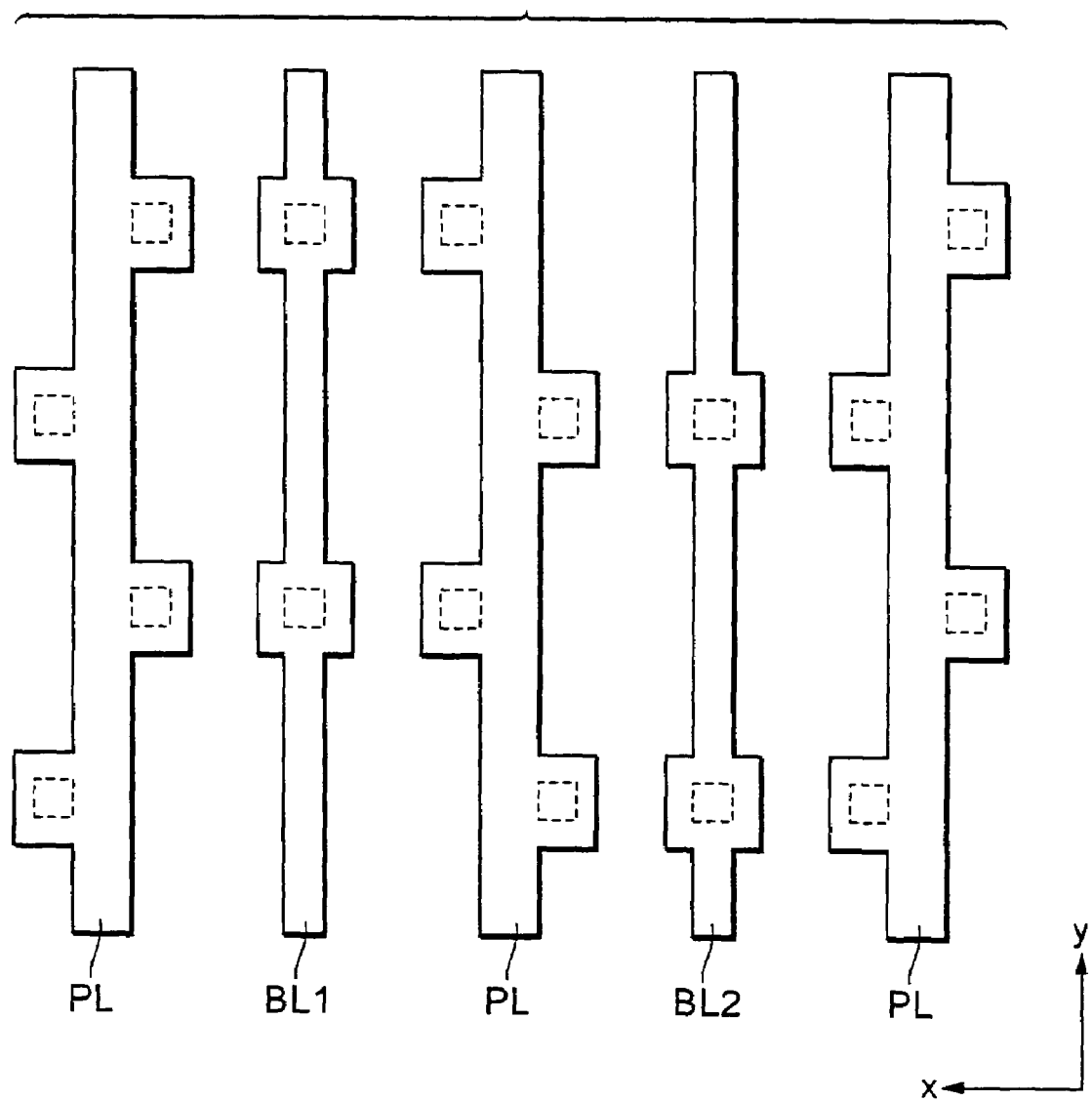
FIG. 16 is a plane view showing the memory cell array 110 according to Embodiment 3.
Figure 17:
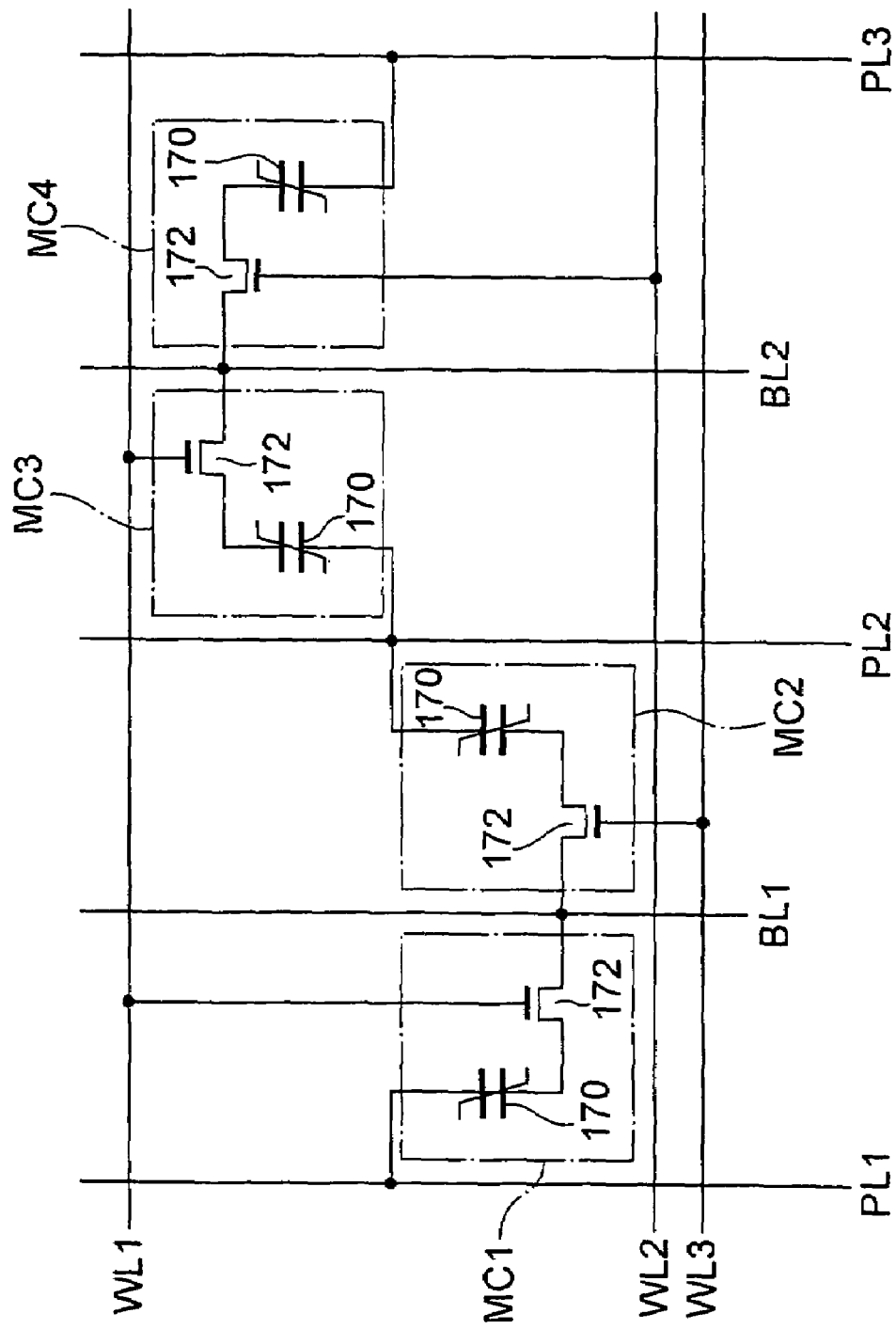
FIG. 17 is a circuit diagram showing the structure of the memory cell array 110 according to Embodiment 3.

FIGS. 15 and 16 are plane views showing a memory cell array 110 according to Embodiment 3. FIG. 16 is a plane view expressly showing the relationship between the bit lines BL and the plate lines PL in FIG. 15. FIG. 17 is a circuit diagram showing the structure of the memory cell array 110 according to Embodiment 3.

In the following explanation, the same reference numerals are given to elements that correspond to those in Embodiment 1; accordingly, detailed explanations for them are omitted and only the differences from Embodiment 1 will be explained.

In Embodiment 3, as shown in FIGS. 15 and 16, the respective plate lines PL extend in the Y direction. In other words, they extend between the respective bit lines BL and almost parallel to the bit lines BL.

More specifically, the plate lines PL are provided to extend from the active regions 114 in predetermined element regions 112 to the active regions 116 in other element regions 112 adjacent to the active regions 114. The plate lines PL also connect the ferroelectric capacitors 170 connected to the active regions 114 and the ferroelectric capacitors 170 connected to the active regions 116 in other element regions adjacent to the active regions 114.

According to Embodiment 3, as explained in relation to Embodiment 1, because the length of the memory cell array 110 in the direction (Y direction) the bit lines BL extend is short, compared to the case where the plate lies PL extend in the X direction, the plate lines PL are short, thereby enabling reduction of the loads on the plate lines PL.

According to Embodiment 3, because the plate lines PL and bit lines BL extend in the same direction, they can be formed on the same level. In this case, the plate lines PL will be disposed where the wirings 72 are arranged in FIGS. 4A and 4B.

FIG. 17 shows the structure of the memory cells MC1 to MC4, which are units repeated in the memory cell array 110. In the memory cell array 110, the memory cells MC1 to MC4 are repeated in the direction the word lines WL and bit lines BL extend.

The memory cells MC1 to MC4 each have a ferroelectric capacitor 170 and a NMOS 172. In each memory cell (MC1 to MC4), the NMOS 172 has one of its source/drain regions connected to a bit line BL and the other connected to one end of the ferroelectric capacitor 170. The NMOS 172 also has its gate connected to one word line WL and switches between connecting and disconnecting one end of the ferroelectric capacitor 170 to the corresponding bit line BL according to the voltage of the word line WL. The other end of the ferroelectric capacitor 170 is connected to a corresponding plate line PL.

More specifically; in the memory cell MC1, the NMOS 172 has one of its source/drain regions connected to a bit line BL1 and its gate connected to a word line WL1; and one end of the ferroelectric capacitor 170 is connected to a plate line PL1. In the memory cell MC2, the NMOS 172 has one of its source/drain regions connected to the bit line BL1 and its gate connected to a word line WL3; and one end of the ferroelectric capacitor 170 is connected to a plate line PL2. In the memory cell MC3, the NMOS 172 has one of its source/drain regions connected to a bit line BL2 and its gate connected to the word line WL1; and one end of the ferroelectric capacitor 170 is connected to the plate line PL2. In the memory cell MC4, the NMOS 172 has one of its source/drain regions connected to the bit line BL2 and its gate connected to a word line WL2; and one end of the ferroelectric capacitor 170 is connected to the plate line PL3.

Embodiment 4

Figure 18:
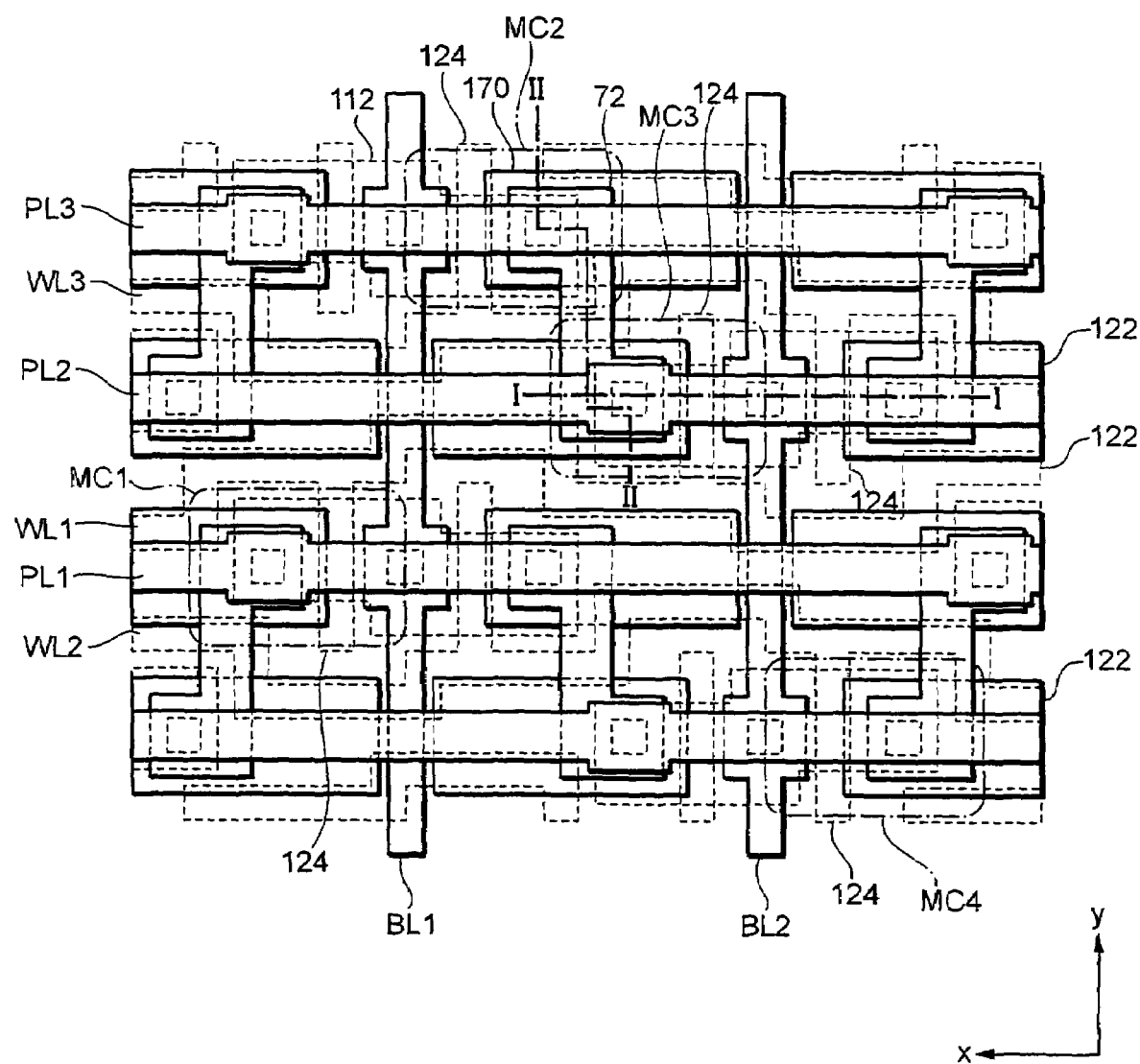
FIG. 18 is a plane view showing a memory cell array 110 according to Embodiment 4.
Figure 19:
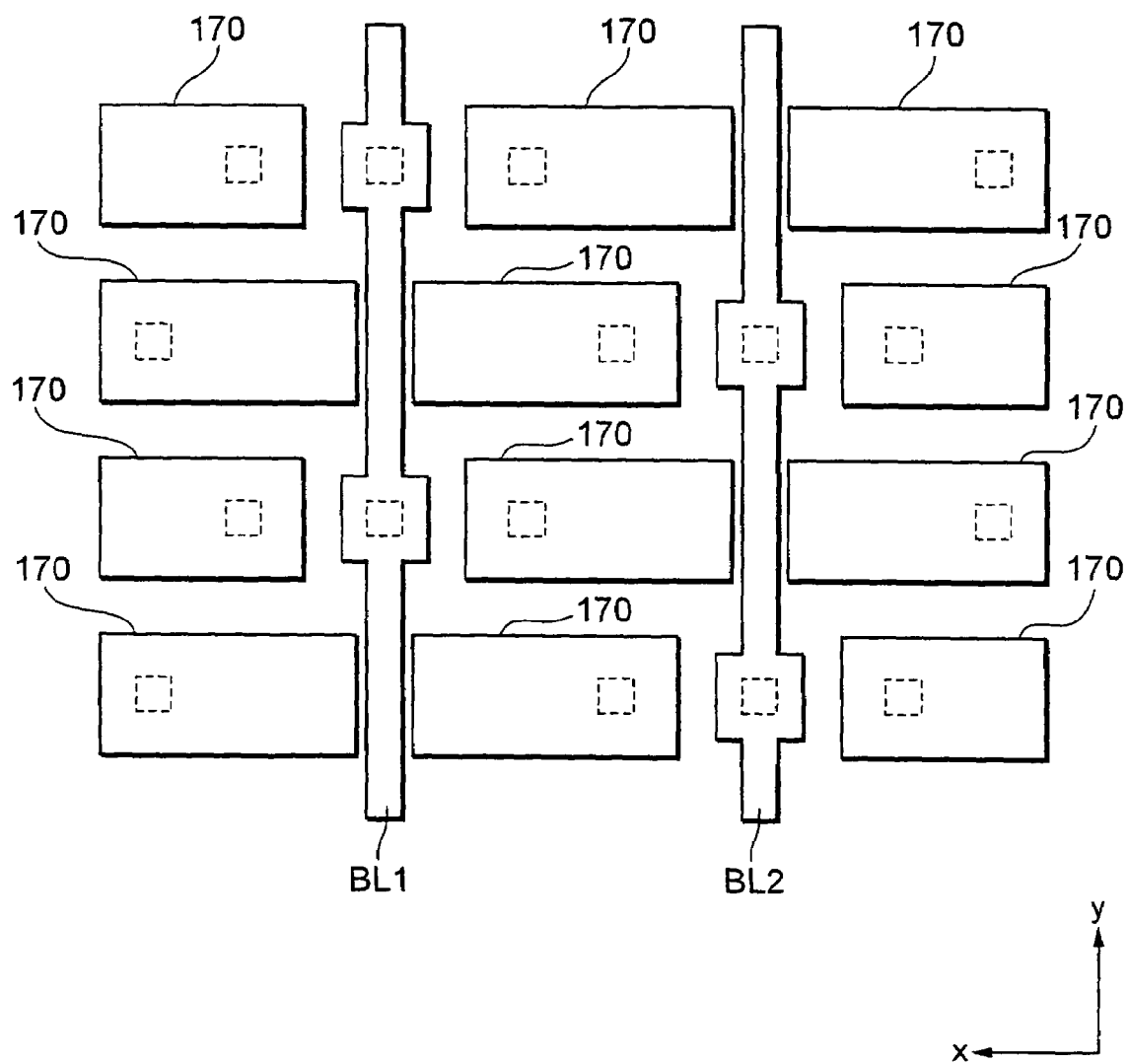
FIG. 19 is a plane view showing the memory cell array 110 according to Embodiment 4.

FIGS. 18 and 19 are plane views showing a memory cell array 110 according to Embodiment 4. FIG. 19 is a plane view showing the arrangement of the ferroelectric capacitors 170 and bit lines BL in FIG. 18. In the following explanation, the same reference numerals are given to the elements that correspond to those in Embodiment 1; accordingly, detailed explanations for them will be omitted and explanations mainly given for the differences from Embodiment 1.

In Embodiment 4, as shown in FIGS. 18 and 19, the formation area for each ferroelectric capacitor 170 is larger than that in Embodiment 1 (FIG. 7).

More specifically, as shown in FIG. 19, each ferroelectric capacitor 170 has a substantially rectangular shape with its long sides extending in the X direction. As shown in FIG. 19, a long formation region is secured for a ferroelectric capacitor 170, the region being long in the direction of the bit line BL adjacent to the bit line BL that drives the ferroelectric capacitor 170.

Consequently, in addition to the effects in Embodiment 1, the quantity of electric charge that can be accumulated in the ferroelectric capacitor 170 increases, thereby increasing the writing and reading margins. Also, writing and reading features are improved.

Moreover, because the footprint of the ferroelectric capacitor 170 is large, the stair-like portions formed because of the presence and absence of the ferroelectric capacitors 170 are reduced.

Incidentally, the plate lines PL may be formed in the shape explained in relation to Embodiment 2 or 3.

Incidentally, although Embodiments 1 and 3 adopt the structure where the bit lines BL are positioned on the level lower than the plate lines PL, the bit lines BL may also be positioned on a level higher than the plate lines PL, as in Embodiment 2.

Also, in Embodiments 1 to 3, the element regions are in a substantially rectangular shape; however, they may also have a different shape (e.g., oval shape). Moreover, in Embodiments 1 to 3, two cells are formed on one element region (i.e., one element region has two transistors and two capacitors; however, without being limited to that structure, one active region may also have just one cell (i.e., one transistor and one capacitor) formed thereon.

Embodiments 1 to 3 have been explained on the premise that the bit lines BL are formed in accordance with the wiring pitch in the display; however, the bit line spacing does not have to be the same as the wiring spacing in the display. Just reducing the gap between these spacings can enable the enhancement of wiring connection and reduce wire connection failures. Accordingly, it is only necessary to adopt the structure of memory cells according to the foregoing embodiments in the memory cell regions.

Explanation for Electro-optic Devices and Electronic Equipment Electro-optic devices and electronic equipment having the foregoing displays will be explained.

Figure 20A:
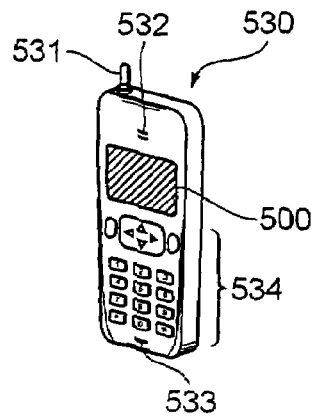
FIG. 20A is a diagram showing an example of electronic equipment using a display.

The invention is used as a drive circuit for an electro-optic device (display device). FIG. 20 shows an example of electronic equipment using a display. FIG. 20A shows an example of the application of the invention in a mobile phone, FIG. 20B shows an example of application in a video camera, FIG. 20C shows an example of application in a TV, and FIG. 20D shows an example of application in a roll-up type TV.

As shown in FIG. 20A, a mobile phone 530 has an antenna 531, voice output unit 532, voice input unit 533, operation unit 534, and electro-optic device (display unit, display) 500. The invention can be applied in this electro-optic device.

Figure 20B:
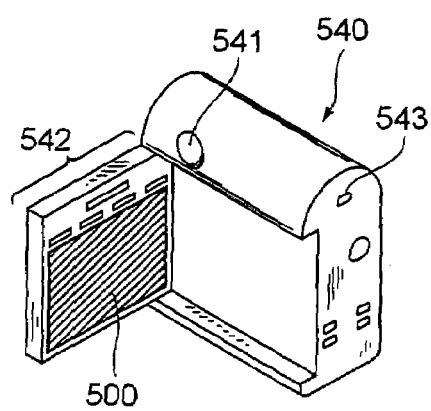
FIG. 20B is a diagram showing an example of electronic equipment using a display.

As shown in FIG. 20B, a video camera 540 has an image-receiving unit 541, operation unit 542, voice input unit 543, and electro-optic device 500. The invention can be applied in this electro-optic device.

Figure 20C:
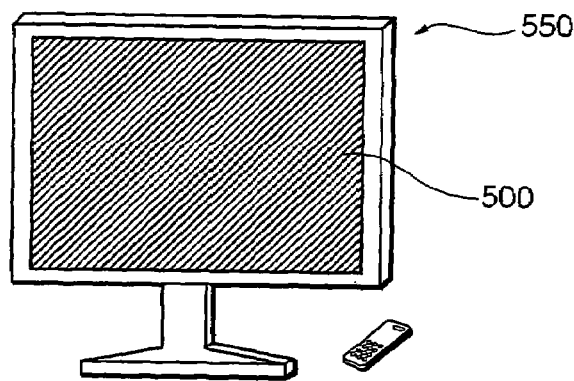
FIG. 20C is a diagram showing an example of electronic equipment using a display.
Figure 20D:
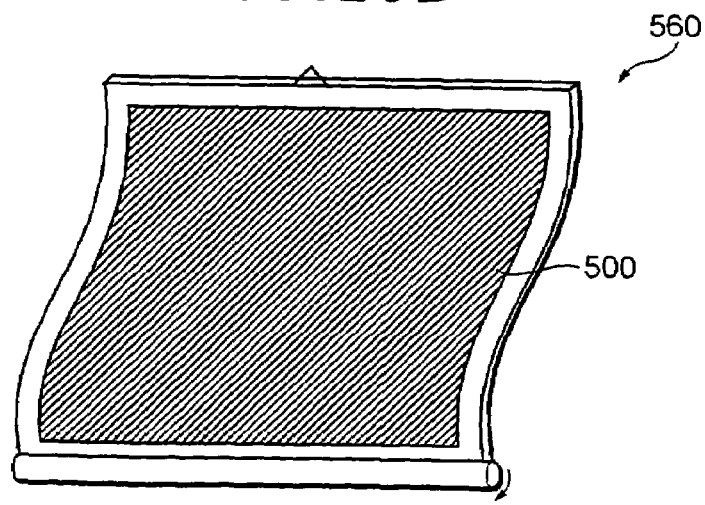
FIG. 20D is a diagram showing an example of electronic equipment using a display.

As shown in FIG. 20C, a television 550 has an electro-optic device 500. The invention can also be applied in this electro-optic device. Incidentally, the invention can also be applied to a monitor used in a personal computer or the like.

As shown in FIG. 20D, a roll-up type television 560 has an electro-optic device 500. The invention can also be applied in this electro-optic device.

Incidentally, examples having electro-optic devices include, in addition to the above, facsimiles with display functions, viewfinders in digital cameras, mobile TVs, electronic personal organizers, electric bulletin boards, and advertisement displays.

Embodiments 1 to 3 were explained for the case where the invention is applied to a memory cell array connected to the drive circuit for a display; however, without being limited to that case, the invention can also be widely applied to various pieces of electronic equipment having FeRAM devices or FeRAM.

Examples and applications explained through the foregoing embodiments can be combined, changed or modified depending on their usage and the invention is not limited to the embodiments explained above. It is obvious in the description in the scope of claims that embodiments realized by any such combination, change or modification are also included in the technical scope of the invention.

What is claimed is:

1. A ferroelectric memory device comprising:
   a first word line extending in a first direction;
   a plurality of element regions arrayed in the first direction on both sides of the first word line; and
   a plurality of first ferroelectric capacitors each connected to the element regions and driven by the first word line,
   wherein the first ferroelectric capacitor is of a shape with its length in the first direction being longer than its length in a second direction perpendicular to the first direction.

2. A ferroelectric memory device comprising:
   a plurality of first word lines extending in a first direction;
   a plurality of second word lines extending in the first direction so that the first word lines and the second word lines are arranged alternately;
   a plurality of element regions arrayed in the first direction on both sides of the first word lines;
   a plurality of first ferroelectric capacitors each connected to the element regions and driven by the first word lines; and
   a plurality of second ferroelectric capacitors each connected to the element regions and driven by the second word lines,
   wherein the element regions are arrayed between the respective first word lines and second word lines; and
   each of the second ferroelectric capacitors is of a shape with its side in the first direction being longer than its side in a second direction perpendicular to the first direction.

3. The ferroelectric memory device according to claim 2 wherein in the first direction, each element region has one end that the first ferroelectric capacitor is connected to and another end that the second ferroelectric capacitor is connected to.

4. The ferroelectric memory device according to claim 3 wherein the element regions are arranged on both sides of each first word line and each second word line alternately in a zigzag format in the first direction.

5. The ferroelectric memory device according to claim 4,
   wherein each element region has a stair-like shape when seen in a plan view;
   in each element region, the widths at both ends are narrower than the width at the middle part; and
   the first word lines and second word lines extend in the first direction while bending between the adjacent element regions.

6. The ferroelectric memory device according to claim 5,
   wherein, in each of the element regions arranged on one side of each first word line, both ends are misaligned and arranged in different directions as seen from a second direction perpendicular to the first direction; and
   in each of the element regions arranged on the other side of each first word line, both ends are misaligned and arranged in different directions as seen from the first direction.

7. The ferroelectric memory device according to claim 5 wherein the first word lines and second word lines bend in accordance with the arrangement and shapes of the adjacent element regions.

8. The ferroelectric memory device according to claim 5, wherein, each of the first word lines and second word lines includes: a main line extending in the first direction; and a plurality of branch lines branched from the main line and extending through the element regions adjacent to the main line.

9. The ferroelectric memory device according to claim 8, wherein the first word lines also bend in accordance with the arrangement of the branch lines of the second word lines; and
   the second word lines also bend in accordance with the arrangement of the branch lines of the first word lines.

10. The ferroelectric memory device according to claim 2 further comprising a plurality of plate lines connected to a plurality of first ferroelectric capacitors and a plurality of second ferroelectric capacitors.

11. The ferroelectric memory device according to claim 10,
    wherein the element regions are arranged on both sides of each first word line and second word line in the first direction; and
    the first ferroelectric capacitor connected to a predetermined element region is connected to the same plate line as the second ferroelectric capacitor connected to another element region adjacent to the predetermined element region with the second word line sandwiched therebetween.

12. The ferroelectric memory device according to claim 10, wherein each of the plate lines extends in the first direction and is connected to the first ferroelectric capacitors and second ferroelectric capacitors connected to the element regions arrayed on both sides of each first word line.

13. The ferroelectric memory device according to claim 10, wherein each of the plate lines extends in the second direction perpendicular to the first direction and is connected to the first ferroelectric capacitors connected to predetermined element regions and the second ferroelectric capacitors connected to other element regions adjacent to the predetermined element regions across the second word line adjacent to the predetermined element regions.

14. The ferroelectric memory device according to claim 10, wherein the element regions are arrayed on both sides of each first word line and second word line; and
    each of the plate lines extends in the second direction perpendicular to the first direction and is alternately connected to the first ferroelectric capacitors and second ferroelectric capacitors provided between the first word line and second word line.

15. A ferroelectric memory device comprising:
    first, second and third word lines;
    first and second plate lines;
    first and second bit lines;
    a first transistor with its gate connected to the first word line and either of its source or drain connected to the first bit line;
    a second transistor with its gate connected to the third word line and either of its source or drain connected to the first bit line;
    a third transistor with its gate connected to the first word line and either of its source or drain connected to the second bit line;
    a fourth transistor with its gate connected to the second word line and either of its source or drain connected to the second bit line;
    a first ferroelectric capacitor with one of its ends connected to the other source or drain of the first transistor and the other end connected to the first plate line;
    a second ferroelectric capacitor with one of its ends connected to the other source or drain of the second transistor and the other end connected to the second plate line;
    a third ferroelectric capacitor with one of its ends connected to the other source or drain of the third transistor and the other end connected to the second plate line; and a fourth ferroelectric capacitor with one of its ends connected to the other source of drain of the fourth transistor and the other end connected to the first plate line.

16. A ferroelectric memory device comprising:

first, second and third word lines;

first, second and third plate lines;

first and second bit lines;

a first transistor with its gate connected to the first word line and either of its source or drain connected to the first bit line;

a second transistor with its gate connected to the third word line and either of its source or drain connected to the first bit line;

a third transistor with its gate connected to the first word line and either of its source or drain connected to the second bit line;

a fourth transistor with its gate connected to the second word line and either of its source or drain connected to the second bit line;

a first ferroelectric capacitor with one of its ends connected to the other source or drain of the first transistor and the other end connected to the first plate line;

a second ferroelectric capacitor with one of its ends connected to the other source or drain of the second transistor and the other end connected to the second plate line;

a third ferroelectric capacitor with one of its ends connected to the other source or drain of the third transistor and the other end connected to the second plate line; and a fourth ferroelectric capacitor with one of its ends connected to the other source of drain of the fourth transistor and the other end connected to the first plate line.

17. A display drive IC comprising the ferroelectric memory device according to claim 1.

18. A piece of electronic equipment comprising the ferroelectric memory device according to claim 1.

* * * * *